United States Patent
Yamazaki et al.

(10) Patent No.: US 12,258,496 B2
(45) Date of Patent: Mar. 25, 2025

(54) CURABLE SILICONE COMPOSITION, CURED PRODUCT OF SAME AND METHOD FOR PRODUCING SAME

(71) Applicant: DOW TORAY CO., LTD., Tokyo (JP)

(72) Inventors: Ryosuke Yamazaki, Ichihara (JP); Kouichi Ozaki, Ichihara (JP); Toru Imaizumi, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 832 days.

(21) Appl. No.: 17/442,654

(22) PCT Filed: Mar. 18, 2020

(86) PCT No.: PCT/JP2020/012028
§ 371 (c)(1),
(2) Date: Sep. 24, 2021

(87) PCT Pub. No.: WO2020/203305
PCT Pub. Date: Oct. 8, 2020

(65) Prior Publication Data
US 2022/0186099 A1 Jun. 16, 2022

(30) Foreign Application Priority Data

Mar. 29, 2019 (JP) ................. 2019-066555

(51) Int. Cl.
| | | |
|---|---|---|
| C09J 183/04 | (2006.01) | |
| B29C 45/00 | (2006.01) | |
| B29K 83/00 | (2006.01) | |
| B32B 7/06 | (2019.01) | |
| B32B 7/12 | (2006.01) | |
| C08L 83/04 | (2006.01) | |
| C09J 5/06 | (2006.01) | |
| C09J 7/35 | (2018.01) | |
| C09J 11/04 | (2006.01) | |
| H01L 23/29 | (2006.01) | |

(52) U.S. Cl.
CPC .............. *C09J 183/04* (2013.01); *B32B 7/06* (2013.01); *B32B 7/12* (2013.01); *C08L 83/04* (2013.01); *C09J 5/06* (2013.01); *C09J 7/35* (2018.01); *C09J 11/04* (2013.01); *B29C 45/0001* (2013.01); *B29K 2083/00* (2013.01); *B32B 2457/14* (2013.01); *C08L 2203/20* (2013.01); *C08L 2205/035* (2013.01); *C09J 2203/326* (2013.01); *C09J 2483/00* (2013.01); *H01L 23/29* (2013.01)

(58) Field of Classification Search
CPC .......... C08J 2383/07; C08J 3/243; C08J 5/18; C08K 2003/2227; C08K 3/013; C08K 5/14; C08K 5/54; C09J 7/10; C09J 183/04; C09J 5/06; C09J 7/35; C09J 11/04; C09J 2203/326; C09J 2483/00; C08L 2205/025; C08L 83/04; C08L 2203/20; C08L 2205/035; B32B 7/06; B32B 7/12; B32B 2457/14; B29C 45/0001; B29C 55/02; B29K 2083/00; H01L 23/29; H01L 23/296; C08G 77/12; C08G 77/20

See application file for complete search history.

(56) References Cited

U.S. PATENT DOCUMENTS

| | | |
|---|---|---|
| 5,100,976 A | 3/1992 | Hamada et al. |
| 5,145,886 A | 9/1992 | Oxman et al. |
| 5,169,727 A | 12/1992 | Boardman |
| 5,357,007 A | 10/1994 | Wengrovius et al. |
| 5,392,592 A | 2/1995 | Bozich et al. |
| 5,977,243 A | 11/1999 | Barthel et al. |
| 6,177,506 B1 | 1/2001 | Takahashi et al. |
| 6,376,569 B1 | 4/2002 | Oxman et al. |
| 6,379,792 B1 | 4/2002 | Isshiki et al. |
| 6,433,055 B1 | 8/2002 | Kleyer et al. |
| 8,124,689 B2 | 2/2012 | Loubert et al. |

(Continued)

FOREIGN PATENT DOCUMENTS

| | | |
|---|---|---|
| AU | 618818 B2 | 1/1992 |
| CN | 101151328 A | 3/2008 |

(Continued)

OTHER PUBLICATIONS

English translation of International Search Report for PCT/JP2019/042320 dated Mar. 24, 2020, 2 pages.

(Continued)

*Primary Examiner* — Kevin R Kruer

(74) *Attorney, Agent, or Firm* — Warner Norcross + Judd LLP

(57) ABSTRACT

Provided is a curable silicone composition and applications thereof. The curable silicone composition has superior hot-melt properties and moldability, where the flexibility, toughness, and stress relief properties of a cured product obtained therefrom are not impaired even if a large amount of functional inorganic filler is blended in. The curable silicone composition comprises an organopolysiloxane resin component with a weight average molecular weight in a range of 2,000 to 15,000 and that contains a siloxane unit represented by $SiO_{4/2}$ making up at least 20 mol % or more of the total siloxane units, and one or more functional fillers. The silicone resin component comprises a curing reactive functional group containing a carbon-carbon double bond, and of that curing reactive functional group, 0.05 to 1.50 mol vinyl ($CH_2=CH-$) group is contained per 100 g of the silicone component. The curable silicone composition generally has hot-melt properties as a whole.

16 Claims, No Drawings

(56) References Cited

U.S. PATENT DOCUMENTS

| | | |
|---|---|---|
| 2002/0132891 A1 | 9/2002 | Azechi et al. |
| 2004/0265599 A1 | 12/2004 | Ushio et al. |
| 2006/0057779 A1 | 3/2006 | Sutoh et al. |
| 2006/0094834 A1 | 5/2006 | Aoki et al. |
| 2006/0270788 A1 | 11/2006 | Ozai et al. |
| 2008/0319144 A1 | 12/2008 | Morita et al. |
| 2009/0042043 A1 | 2/2009 | Joseph et al. |
| 2009/0075009 A1 | 3/2009 | Fujisawa et al. |
| 2009/0171013 A1 | 7/2009 | Taguchi et al. |
| 2009/0281222 A1 | 11/2009 | Nishiumi et al. |
| 2011/0104506 A1 | 5/2011 | Behl et al. |
| 2011/0236666 A1 | 9/2011 | Hall et al. |
| 2012/0139131 A1 | 6/2012 | Sugo et al. |
| 2013/0183776 A1 | 7/2013 | Kashiwagi et al. |
| 2013/0200554 A1 | 8/2013 | Mueller |
| 2013/0274398 A1 | 10/2013 | Shiobara et al. |
| 2014/0296468 A1 | 10/2014 | Kownacka et al. |
| 2014/0377570 A1 | 12/2014 | Hirai et al. |
| 2015/0115311 A1 | 4/2015 | Yoshida et al. |
| 2015/0124338 A1 | 5/2015 | Mayumi et al. |
| 2015/0183960 A1 | 7/2015 | Yamazaki et al. |
| 2015/0315427 A1 | 11/2015 | Yoshida et al. |
| 2015/0376482 A1 | 12/2015 | Bekemeier et al. |
| 2016/0230005 A1 | 8/2016 | Mayumi et al. |
| 2016/0311980 A1 | 10/2016 | Knoer |
| 2017/0057980 A1 | 3/2017 | Boyer et al. |
| 2017/0058103 A1 | 3/2017 | Fujisawa et al. |
| 2017/0092822 A1 | 3/2017 | Amako et al. |
| 2017/0166701 A1 | 6/2017 | Jo et al. |
| 2017/0283613 A1 | 10/2017 | Mochizuki |
| 2017/0355804 A1 | 12/2017 | Fujisawa et al. |
| 2018/0105692 A1 | 4/2018 | Imaizumi et al. |
| 2018/0208816 A1 | 7/2018 | Yamazaki et al. |
| 2018/0305547 A1 | 10/2018 | Dogen et al. |
| 2019/0169398 A1 | 6/2019 | Yamazaki |
| 2019/0169435 A1 | 6/2019 | Yamazaki |
| 2019/0177488 A1 | 6/2019 | Yamazaki |
| 2019/0276684 A1 | 9/2019 | Yamazaki et al. |
| 2019/0367744 A1 | 12/2019 | Chevalier et al. |
| 2020/0216671 A1 | 7/2020 | Matsuzaki et al. |
| 2020/0224069 A1 | 7/2020 | Itoh et al. |
| 2020/0354615 A1 | 11/2020 | Itoh et al. |
| 2020/0392335 A1 | 12/2020 | Yamazaki |
| 2021/0162704 A1 | 6/2021 | Sreeram et al. |
| 2021/0179783 A1 | 6/2021 | Yoshitake |
| 2021/0179849 A1 | 6/2021 | Yoshitake |
| 2021/0189129 A1 | 6/2021 | Yamazaki et al. |
| 2021/0198489 A1 | 7/2021 | Yoshitake |
| 2021/0269691 A1 | 9/2021 | Itoh et al. |
| 2021/0284888 A1 | 9/2021 | Itoh et al. |
| 2021/0292607 A1 | 9/2021 | Itoh et al. |
| 2022/0002493 A1 | 1/2022 | Sugie et al. |
| 2022/0048230 A1 | 2/2022 | Imaizumi et al. |
| 2022/0064447 A1 | 3/2022 | Yamazaki |
| 2022/0064491 A1 | 3/2022 | Yamazaki |
| 2022/0089872 A1 | 3/2022 | Fukui et al. |
| 2022/0169894 A1 | 6/2022 | Yamazaki et al. |
| 2022/0186099 A1 | 6/2022 | Yamazaki et al. |
| 2022/0195269 A1 | 6/2022 | Yamazaki |
| 2022/0340756 A1 | 10/2022 | Nishijima et al. |
| 2022/0403114 A1 | 12/2022 | Sugie et al. |
| 2023/0044439 A1 | 2/2023 | Yamamoto et al. |
| 2023/0137947 A1 | 5/2023 | Yamazaki et al. |
| 2023/0151215 A1 | 5/2023 | Yamazaki et al. |
| 2024/0002605 A1 | 1/2024 | Tanaka et al. |
| 2024/0052106 A1 | 2/2024 | Yamazaki et al. |
| 2024/0052220 A1 | 2/2024 | Yamamoto et al. |

FOREIGN PATENT DOCUMENTS

| | | |
|---|---|---|
| CN | 103849149 A | 6/2014 |
| CN | 104870585 A | 8/2015 |
| CN | 106459419 A | 2/2017 |
| CN | 106715593 A | 5/2017 |
| CN | 107429062 A | 12/2017 |
| CN | 108026373 A | 5/2018 |
| CN | 109844029 A | 6/2019 |
| EP | 1002834 A1 | 5/2000 |
| EP | 3954739 A1 | 2/2022 |
| EP | 4083140 A1 | 11/2022 |
| EP | 4130157 A1 | 2/2023 |
| EP | 4269503 A1 | 11/2023 |
| JP | H0275681 A | 3/1990 |
| JP | H0625602 A | 2/1994 |
| JP | H10195085 A | 7/1998 |
| JP | H11158379 A | 6/1999 |
| JP | H11279182 A | 10/1999 |
| JP | H11335572 A | 12/1999 |
| JP | 2000063681 A | 2/2000 |
| JP | 2000198929 A | 7/2000 |
| JP | 2001019933 A | 1/2001 |
| JP | 2002155261 A | 5/2002 |
| JP | 2003176462 A | 6/2003 |
| JP | 2003226812 A | 8/2003 |
| JP | 2004043814 A | 2/2004 |
| JP | 2004307691 A | 11/2004 |
| JP | 2004315571 A | 11/2004 |
| JP | 2005007331 A | 1/2005 |
| JP | 2006188593 A | 7/2006 |
| JP | 2006274007 A | 10/2006 |
| JP | 2007119768 A | 5/2007 |
| JP | 2007231039 A | 9/2007 |
| JP | 2009503133 A | 1/2009 |
| JP | 2009132797 A | 6/2009 |
| JP | 2009155415 A | 7/2009 |
| JP | 2010047646 A | 3/2010 |
| JP | 2010047676 A | 3/2010 |
| JP | 2010509088 A | 3/2010 |
| JP | 2011525444 A | 9/2011 |
| JP | 2012017427 A | 1/2012 |
| JP | 2013076050 A | 4/2013 |
| JP | 2013523482 A | 6/2013 |
| JP | 2013147546 A | 8/2013 |
| JP | 2013221075 A | 10/2013 |
| JP | 2013221082 A | 10/2013 |
| JP | 2013222761 A | 10/2013 |
| JP | 2013232580 A | 11/2013 |
| JP | 5385247 B2 | 1/2014 |
| JP | 2014009322 A | 1/2014 |
| JP | 2014221915 A | 11/2014 |
| JP | 2015010132 A | 1/2015 |
| JP | 2015110752 A | 6/2015 |
| JP | 2015214637 A | 12/2015 |
| JP | 2016124967 A | 7/2016 |
| JP | 2017512224 A | 5/2017 |
| JP | 2017101137 A | 6/2017 |
| JP | 2017520918 A | 7/2017 |
| JP | 2017226724 A | 12/2017 |
| JP | 2018519369 A | 7/2018 |
| JP | 2018177993 A | 11/2018 |
| JP | 2019167832 A | 10/2019 |
| JP | 2019167833 A | 10/2019 |
| JP | 2021107149 A | 7/2021 |
| JP | 2021108319 A | 7/2021 |
| TW | 201439219 A | 10/2014 |
| WO | 2006104236 A1 | 10/2006 |
| WO | 2008056810 A1 | 5/2008 |
| WO | 2013051600 A1 | 4/2013 |
| WO | 2014002918 A1 | 1/2014 |
| WO | 2014136805 A1 | 9/2014 |
| WO | 2015056483 A1 | 4/2015 |
| WO | 2015126780 A1 | 8/2015 |
| WO | 2015155949 A1 | 10/2015 |
| WO | 2016038836 A1 | 3/2016 |
| WO | 2016103654 A1 | 6/2016 |
| WO | 2016136243 A1 | 9/2016 |
| WO | 2017068762 A1 | 4/2017 |
| WO | 2018028792 A1 | 2/2018 |
| WO | 2018030286 A1 | 2/2018 |
| WO | 2018030287 A1 | 2/2018 |
| WO | 2018030288 A1 | 2/2018 |
| WO | 2018084012 A1 | 5/2018 |
| WO | 2018186161 A1 | 10/2018 |
| WO | 2018235491 A1 | 12/2018 |

(56) References Cited

FOREIGN PATENT DOCUMENTS

| | | |
|---|---|---|
| WO | 2018235492 A1 | 12/2018 |
| WO | 2019059351 A1 | 3/2019 |
| WO | 2019078140 A1 | 4/2019 |
| WO | 2019088067 A1 | 5/2019 |
| WO | 2019208756 A1 | 10/2019 |
| WO | 2020090797 A | 5/2020 |
| WO | 2020138055 A1 | 7/2020 |
| WO | 2020138409 A1 | 7/2020 |
| WO | 2020138410 A1 | 7/2020 |
| WO | 2020166692 A1 | 8/2020 |
| WO | 2020203304 A1 | 10/2020 |
| WO | 2020203307 A1 | 10/2020 |
| WO | 2021132710 A1 | 7/2021 |
| WO | 2021200643 A1 | 10/2021 |
| WO | 2022004463 A1 | 1/2022 |
| WO | 2022138336 A1 | 6/2022 |

OTHER PUBLICATIONS

Machine assisted English translation of JP2010047676A obtained from https://patents.google.com/patent on Jul. 21, 2021, 9 pages.
Machine assisted English translation of JP2015214637A obtained from https://patents.google.com/patent on Jul. 21, 2021, 11 pages.
Machine assisted English translation of JP2017101137A obtained from https://patents.google.com/patent on Jul. 21, 2021, 11 pages.
English translation of International Search Report for PCT/JP2021/046092 dated Feb. 8, 2022, 2 pages.
English translation of International Search Report for PCT/JP2021/046093 dated Mar. 15, 2022, 2 pages.
Dowsiltm EA-4600 Silicone Adhesive Application Guide for PCT Device Assemblies (Dow Toray Co., Ltd. publication, Form No. 1-3497-42-1120 S2D, 2020).
Machine assisted English translation of WO2019208756A1 obtained from https://worldwide.espacenet.com/patent on Dec. 21, 2023, 32 pages.
Machine assisted English translation of JP2017226724A obtained from https://patents.google.com/patent on Aug. 14, 2024, 14 pages.
Machine assisted English translation of JP2003226812A obtained from https://patents.google.com/patent on Aug. 14, 2024, 11 pages.
Machine assisted English translation of JP2010047646A obtained from https://patents.google.com/patent on Aug. 14, 2024, 9 pages.
International Search Report for PCT/JP2020/012028 dated Jun. 9, 2020, 3 pages.
Machine assisted English translation of JP2013221082A obtained from https://patents.google.com/patent on Oct. 27, 2021, 14 pages.
Machine assisted English translation of WO2020138410A1 obtained from https://patents.google.com/patent on Oct. 27, 2021, 19 pages.
Machine assisted English translation of WO2020138409A1 obtained from https://patents.google.com/patent on Oct. 27, 2021, 24 pages.
Machine assisted English translation of WO2018235492A1 obtained from https://patents.google.com/patent on Oct. 27, 2021, 21 pages.
Machine assisted English translation of JP11335572A obtained from https://patents.google.com/patent on Oct. 27, 2021, 7 pages.
Machine assisted English translation of JPH11279182A obtained from https://patents.google.com/patent on Oct. 27, 2021, 8 pages.
Machine assisted English translation of JP2003176462A obtained from https://patents.google.com/patent on Oct. 27, 2021, 11 pages.
Machine assisted English translation of JP2009132797A obtained from https://patents.google.com/patent on Oct. 27, 2021, 9 pages.
Machine assisted English translation of JP2012017427A obtained from https://patents.google.com/patent on Oct. 27, 2021, 13 pages.
Machine assisted English translation of JP2000063681A obtained from https://patents.google.com/patent on Oct. 28, 2021, 8 pages.
Machine assisted English translation of CN103849149A obtained from https://worldwide.espacenet.com/patent on Jan. 22, 2024, 11 pages.
Machine assisted English translation of CN106715593A obtained from https://patents.google.com/patent on Mar. 14, 2023, 26 pages.
Machine assisted English translation of JP2005007331A obtained from https://patents.google.com/patent on Mar. 14, 2023, 15 pages.
Machine assisted English translation of JP2004315571A obtained from https://patents.google.com/patent on Mar. 14, 2023, 15 pages.
Machine assisted English translation of JP2015010132A obtained from https://patents.google.com/patent on Mar. 14, 2023, 22 pages.
Machine assisted English translation of JP2004307691A obtained from https://patents.google.com/patent on Mar. 14, 2023, 11 pages.
Machine assisted English translation of JP2013222761A obtained from https://patents.google.com/patent on Mar. 15, 2023, 20 pages.
Machine assisted English translation of JP2018177993A obtained from https://patents.google.com/patent on Mar. 15, 2023, 36 pages.
International Search Report for PCT/JP2019/051394 dated Mar. 17, 2020, 2 pages.
Machine assisted English translation of WO2018235492A1 obtained from https://patents.google.com/patent on Oct. 4, 2021, 20 pages.
Machine assisted English translation of JP2016124967A obtained from https://patents.google.com/patent on Oct. 4, 2021, 18 pages.
Machine assisted English translation of WO2016038836A1 obtained from https://patents.google.com/patent on Oct. 4, 2021, 18 pages.
Machine assisted English translation of WO2013051600A1 obtained from https://patents.google.com/patent on Oct. 4, 2021, 25 pages.
Machine assisted English translation of JP2007231039A obtained from https://patents.google.com/patent on Oct. 5, 2021, 7 pages.
International Search Report for PCT/JP2019/051393 dated Mar. 17, 2020, 3 pages.
International Search Report for PCT/JP2019/051392 dated Mar. 17, 2020, 2 pages.
International Search Report for PCT/JP2019/051391 dated Mar. 13, 2020, 3 pages.
International Search Report for PCT/JP2020/012027 dated Jun. 9, 2020, 3 pages.
International Search Report for PCT/JP2020/012030 dated Jun. 9, 2020, 2 pages.
International Search Report for PCT/JP2020/012029 dated Jun. 9, 2020, 3 pages.
International Search Report (with English translation) for PCT/JP2020/049074 dated Mar. 23, 2021, 7 pages.
Machine assisted English translation of JPH0625602 obtained from https://patents.google.com/patent on Nov. 11, 2022, 6 pages.
Machine assisted English translation of JP2019167832 obtained from https://patents.google.com/patent on Nov. 11, 2022, 11 pages.
Machine assisted English translation of JP2019167833 obtained from https://patents.google.com/patent on Nov. 11, 2022, 9 pages.
International Search Report (with English translation) for PCT/JP2021/012840 dated Jun. 15, 2021, 6 pages.
English translation of International Search Report for PCT/JP2022/046146 dated Jan. 31, 2023, 2 pages.
Machine assisted English translation of JP2017101137A obtained from https://worldwide.espacenet.com/patent on Apr. 7, 2024, 18 pages.
Machine assisted English translation of JP2021108319A obtained from https://worldwide.espacenet.com/patent on Mar. 12, 2024, 73 pages.
Machine assisted English translation of WO2020138055A1 obtained from https://worldwide.espacenet.com/patent on Apr. 7, 2024, 43 pages.
Machine assisted English translation of JPH11158379A obtained from https://worldwide.espacenet.com/patent on Nov. 9, 2023, 11 pages.
Machine assisted English translation of JP2014221915A obtained from <https://patents.google.com/patent> on Nov. 20, 2024, 17 pages.
Machine assisted English translation of JPH10195085A obtained from https://patents.google.com/patent on Jan. 22, 2025, 10 pages.

CURABLE SILICONE COMPOSITION, CURED PRODUCT OF SAME AND METHOD FOR PRODUCING SAME

CROSS-REFERENCE TO RELATED APPLICATIONS

This application is the U.S. National Stage of International Application No. PCT/JP 2020/012028 filed on 18 Mar. 2020, which claims priority to and all advantages of Japanese Application No. 2019-066555 filed on 29 Mar. 2019, the content of which is incorporated herein by reference.

TECHNICAL FIELD

The present invention relates to a curable silicone composition which can be obtained using a simple manufacturing method, has excellent hot-melt properties and moldability, and where flexibility, toughness, and stress relief properties of the cured product obtained are not impaired even if a large amount of functional inorganic filler is blended therewith, and to a molded product (pellet, sheet, and the like) and a cured product thereof. The present invention is related to a cured product of the composition as well as applications thereof (including, in particular, a member for semiconductors and a semiconductor provided with the cured product, and the like), a method for manufacturing the composition and a method for molding the cured product, and the like.

BACKGROUND ART

Curable silicone compositions are utilized in a wide range of industrial fields because they are cured to form cured products having superior heat resistance, cold resistance, electrical insulation, weather resistance, water repellency, and transparency. In general, the cured product of such a curable silicone composition is also suitable as an encapsulant for optical materials and semiconductor devices because the composition is not readily discolored as compared with other organic materials, and there is less deterioration of physical properties.

The present applicant has proposed, in Patent Document 1 and Patent Document 2, a so-called hot-melt curable granular silicone composition and a reactive silicone composition for molding. In Patent Document 3, the applicant also discloses a transparent hot-melt curable silicone composition that uses a methyl silicone resin.

On the other hand, in recent years, optical semiconductor devices and the like have become smaller with higher output, and there is a strong need for silicone compositions that meet the requirements of improved thermal conductivity and heat dissipation characteristics by blending functional fillers such as alumina and other heat-dissipating fillers into the composition, in addition to improving the physical properties such as the coefficient of linear expansion of the cured product. For example, Patent Document 4 proposes a hot-melt curable silicone composition in which a high amount of functional filler is filled in the composition.

However, when a large amount of functional inorganic filler is blended in these compositions, the melting properties (=hot-melt properties) of the composition and the toughness and flexibility of the cured product are drastically impaired. Therefore, for example, achieving high thermal conductivity by blending a large amount of thermally conductive inorganic filler such as alumina, or greatly reducing the coefficient of linear expansion by blending a large amount of dimensionally stable inorganic filler such as silica was difficult. Therefore, there is a strong need for a curable silicone composition where flexibility, toughness, and stress relief properties of the resulting cured product are not impaired even when a large amount of functional inorganic filler is blended therein, and that has excellent hot-melt and moldability properties.

RELATED ART DOCUMENTS

Patent Documents

Patent Document 1: International Unexamined Patent Application 2016/136243
Patent Document 2: Japanese Unexamined Patent Application 2014-009322
Patent Document 3: Japanese Unexamined Patent Application Publication (Translation of PCT Application) No. 2017-512224
Patent Document 4: Japanese Unexamined Patent Application 2013-221082

SUMMARY OF THE INVENTION

Problem to be Solved by the Invention

An object of the present invention is to provide a curable silicone composition which has hot-melt properties, superior workability for overmolding and such, and superior curing characteristics, and which provides a cured product whose flexibility, toughness, or stress relief properties are not impaired even if a large amount of functional inorganic filler is blended therein. Furthermore, the present invention provides these curable silicone compositions in the form of particles, pellets, sheets, and the like, and in the form of peelable laminates containing said curable silicone composition sheets. An object of the present invention is to provide a semiconductor device member made up of a curable silicone composition cured product, a semiconductor device having the cured product, and a molding method of the cured product.

Means to Solve the Problem

As a result of diligent investigation, the inventors discovered that the problems described above can be resolved using a curable silicone composition having hot-melt properties as an entire composition, such composition comprising (A) organopolysiloxane resin component having a weight average molecular weight (Mw) in the range of 2,000 to 15,000 as measured by gel permeation chromatography (GPC) using toluene as a solvent, and where 20 mol % or more of the total siloxane units of the resin is siloxane units represented by $SiO_{4/2}$, and (D) one or more functional fillers, wherein the silicone component of the curable silicone composition comprises curing-reactive functional group containing a carbon-carbon double bond and, of that curing reactive functional group, 0.05 to 1.50 mol vinyl ($CH_2=CH-$) group is contained per 100 g of the silicone component in the composition, and achieved the present invention.

In further detail, the inventors recognized that the problems described above may be resolved using the curable silicone composition described hereinbelow and achieved the present invention:

a curable silicone composition having hot-melt properties, such composition comprising:
(A) organopolysiloxane resin component having a weight average molecular weight (Mw) in the range of 2,000 to 15,000 as measured by gel permeation chromatography (GPC) using toluene as a solvent and where 20 mol % or more of the total siloxane units of the resin is siloxane units represented by $SiO_{4/2}$; and
(D) one or more functional fillers, wherein
the silicone component of the curable silicone composition comprises curing-reactive functional group containing a carbon-carbon double bond and, of that curing reactive functional group, 0.05 to 1.50 mol vinyl ($CH2=CH—$) group is contained per 100 g of the silicone component;
a curable silicone composition having hot-melt properties, such composition comprising:
(A) 100 mass parts of organopolysiloxane resin component containing component (A1) and component (A2) in a mass ratio of 0:100 to 75:25 and the weight average molecular weight (Mw) of component (A1) and component (A2) is in the range of 2,000 to 15,000 as measured using gel permeation chromatography (GPC) with toluene as a solvent using polystyrene standards:
  (A1) an organopolysiloxane resin having no hot-melt properties as a whole molecule, having a curing-reactive functional group having a carbon-carbon double bond in the molecule, and where 20 mol % or more of the total siloxane units of the resin is siloxane units represented by $SiO_{4/2}$;
  (A2) an organopolysiloxane resin having no hot-melt properties as a whole molecule, having no curing-reactive functional groups with a carbon-carbon double bond in the molecule, and where 20 mol % or more of the total siloxane units of the resin is siloxane units represented by $SiO_{4/2}$;
(B) 10 to 100 mass parts of straight- or branched-chain organopolysiloxane, liquid at 25° C., having at least two curing reactive functional groups containing a carbon-carbon double bond in the molecule;
(C) one or more curing agents selected from (c1) or (c2) below, in an amount necessary to cure the composition:
  (c1) an organic peroxide
  (c2) an organohydrogenpolysiloxane having at least two silicon-bonded hydrogen atoms in a molecule and hydrosilylation reaction catalyst,
(D) functional filler,
wherein the amount of component (D) is in the range of 10 to 2000 mass parts relative to 100 mass parts of the sum of component (A) and component (B);
  the amount of vinyl ($CH2=CH—$) group in the curing-reactive functional group including a carbon-carbon double bond per 100 g of silicone component in the composition is 0.05 to 1.50 mols;
a curable silicone composition having hot-melt properties, such composition comprising:
(A) 100 mass parts of an organopolysiloxane resin containing component (A1) and component (A2) in a mass ratio of 0:100 to 75:25 and the weight average molecular weight (Mw) of component (A1) and component (A2) is each in the range of 2,000 to 15,000 as measured using gel permeation chromatography (GPC) with toluene as a solvent and polystyrene standards,
  (A1) an organopolysiloxane resin having no hot-melt properties as a whole molecule, having a curing-reactive functional group with a carbon-carbon double bond in the molecule, and 20 mol % or more of its total siloxane units is siloxane units represented by $SiO_{4/2}$;
  (A2) an organopolysiloxane resin having no hot-melt properties as a whole molecule, having no curing-reactive functional groups with a carbon-carbon double bond in the molecule, and 20 mol % or more of its total siloxane units is siloxane units represented by $SiO_{4/2}$;
(B) 10 to 100 mass parts of a straight- or branched-chain organopolysiloxane, liquid at 25° C., having at least two curing reactive functional groups per molecule, each group comprising a carbon-carbon double bonds;
(C) one or more curing agents selected from (c1) or (c2) below, in an amount necessary to cure the composition:
  (c1) an organic peroxide
  (c2) an organohydrogenpolysiloxane having at least two silicon-bonded hydrogen atoms in the molecule and a hydrosilylation reaction catalyst;
(D) functional filler; wherein
the amount of component (D) is in the range of 10 to 2000 mass parts per 100 mass parts of the sum of component (A) and component (B). The curable silicone composition as described above may be in the form of particles, pellets, or sheets.

The curable silicone composition described above may be in the form of a substantially flat, 10-1000 μm thick cured silicone composition sheet.

Furthermore, the curable silicone composition described above can be used in a peelable laminate having the following configuration. In other words, the form may be a peelable laminate including:
the curable silicone composition sheet described above, and a sheet-like substrate equipped with a release surface, to be positioned so that the release surface is facing the curable silicone composition sheet on one or both surfaces of the curable silicone composition sheet. Such curable silicone composition sheets may be used as film or sheet silicone adhesives.

Furthermore, the present inventors have found that the cured product of the curable silicone composition, in particular, use of the cured product as a member for semiconductor devices, and semiconductor devices having the cured product (including one or more types selected from power semiconductor devices, optical semiconductor devices, and semiconductor devices mounted on flexible circuit boards) can resolve the problem described above, thus arriving at the present invention.

Similarly, the inventors have found that the above problem can be solved by a manufacturing method characterized in that the components that make up the curable silicone composition described above are granulated by mixing only them under temperature conditions not exceeding 50° C., and a molding method of the cured product using the curable granular silicone composition described above.

Note that examples of the molding method described above include transfer molding, compression molding, or injection molding, and the curable silicone composition of the present invention is suitably used as a material for these molding methods. Furthermore, the curable silicone composition of the present invention can be suitably used as a molding material in a so-called overmold method, which is a step of coating a semiconductor element or a semiconductor circuit board with the cured product by overmold molding.

Similarly, the present inventors provide a method for manufacturing a curable silicone composition sheet, including the following steps.
Step 1: step of mixing raw material components of the curable silicone composition described above at a temperature of 50° C. or higher Step 2: step of kneading the mixture obtained in step 1 while heat-melting Step 3: step of laminating the heat-melted mixture obtained in step 2 between films equipped with at least one release surface Step 4: step of extending the laminate body obtained in step 3 between rollers to mold a curable silicone sheet having a specific film thickness Effect of the Invention The curable silicone composition of the present invention has hot-melt properties, superior workability for overmolding and such, and superior curing characteristics, and provide cured products with no loss of flexibility or stress relief properties even when a large amount of filler is blended in. In addition, these curable silicone compositions can be produced using only simple mixing processes and can be efficiently manufactured. Furthermore, the present invention enables these curable silicone compositions to be provided in the form of granules, pellets, sheets, and the like, as well as in the form of peelable laminates containing said curable silicone composition sheets. Furthermore, a member for a semiconductor device that makes up a cured product of the curable silicone composition described above, a semiconductor device having the cured product, and a method for molding the cured product can be provided.

DESCRIPTION OF THE PREFERRED EMBODIMENTS

[Curable Silicone Composition]

The curable silicone composition of the present invention includes (A) an organopolysiloxane resin component having a weight average molecular weight (Mw) in the range of 2,000 to 15,000 as measured by gel permeation chromatography (GPC) using toluene as a solvent and polystyrene standards, and where 20 mol % or more of the total siloxane units of the resin is siloxane units represented by $SiO_{4/2}$ and (D) one or more functional fillers, wherein silicone component of the curable silicone composition comprises curing-reactive functional group containing a carbon-carbon double bond and, of that curing-reactive functional group, 0.05 to 1.50 mol vinyl ($CH2=CH-$) group is contained per 100 g of silicone component in the composition, and the composition as a whole has hot-melt properties. In the present invention, unless otherwise stated, "having hot-melt properties" means having a softening point of 50 to 200° C., having a melt viscosity at 150° C. (preferably, a melt viscosity of less than 1,000 Pa-s), and having flowing properties.

In other words, the curable silicone composition of the present invention is characterized by its inclusion of functional fillers such as reinforcing fillers and thermally conductive fillers, use of organopolysiloxane resin having a high content of branching siloxane units ($SiO_{4/2}$) in a specific molecular weight range, and its content of curable functional groups in the total silicone component being relatively low. This configuration can provide a cured product with no dramatic loss of flexibility or stress relief properties even when a large amount of functional filler is blended in. The curable silicone composition of the present invention may be and is preferably molded into granules, pellet, or sheet form, depending on the application thereof. Hereinafter, each component and optional component of the composition will be described. In the present invention, the term "average particle diameter" means the average particle diameter of the primary particles unless otherwise defined.

[Weight Average Molecular Weight of Organopolysiloxane Resin]

The curable silicone composition of the present invention has a weight average molecular weight (Mw) in the range of 2,000 to 15,000 as measured by gel permeation chromatography (GPC) using toluene as a solvent and polystyrene as standards, and is characterized as comprising organopolysiloxane resin where 20 mol % or more of the total siloxane units of the resin is siloxane units represented by $SiO_{4/2}$. The weight average molecular weight (Mw) of said organopolysiloxane resin is preferably in the range of 2,000 to 10,000. Herein, if the weight average molecular weight (Mw) of the organopolysiloxane resin exceeds said upper limit, when a large amount of functional inorganic filler is blended in, deterioration of melting properties, a marked increase in hardness, and embrittlement may occur, and the problem of the present invention may not be solved. If the weight average molecular weight (Mw) of the organopolysiloxane resin is less than the lower limit described above, the organopolysiloxane resin will be liquid at room temperature, and good hot-melt properties cannot be imparted to the resulting compound. That is, if an organopolysiloxane resin having a molecular weight outside the weight average molecular weight (Mw) range described above is used, the technical effects of the present invention may not be achieved.

The organopolysiloxane resin may further contain siloxane units represented by $R_3SiO_{1/2}$, $R_2SiO_{2/2}$, $RSiO_{3/2}$ (R is a monovalent organic group), or hydroxyl or alkoxy groups represented by $R^2O_{1/2}$ ($R^2$ is a hydrogen atom or an alkyl group having 1 to 10 carbon atoms); however, suitably 40 mol % or more, in particular in the range of 40 to 90 mol % of the total siloxane units is siloxane units represented by $SiO_{4/2}$. The amount of $SiO_{4/2}$ can be adjusted so long as the amount is within the molecular weight range described above. If the content of the siloxane unit represented by $SiO_{4/2}$ is less than the lower limit described above, the technical effect of the present invention may not be achieved even if a large amount of other branching siloxane units (for example, $RSiO_{3/2}$) are included.

[Functional Filler]

The curable silicone composition of the present invention contains one or more functional fillers. A functional filler is a component that imparts mechanical or other properties to the cured product, and can be inorganic fillers, organic fillers, and mixtures thereof. Examples of the inorganic fillers include a reinforcing filler, a white pigment, a thermally conductive filler, an electrically conductive filler, a phosphor, and mixtures of at least two of these, and examples of organic fillers include a silicone resin filler, a fluorine resin filler, and a polybutadiene resin filler. The shape of these fillers is not particularly limited, and may be spherical, spindle-shaped, flat, needle-shaped, amorphous, or the like. In particular, the curable silicone composition of the present invention is suitable for use in compositions where the addition of a large amount of inorganic filler needs to be added to impart a function, such as a thermally conductive filler, because the toughness and stress relief properties of the cured product are not dramatically impaired even when a large amount of functional filler is blended in. The type and amount of functional fillers, their surface treatment, and other optional configurations will be discussed below.

[Vinyl Content in the Composition] The curable silicone composition of the present invention has the following requirements: of the silicone component, specifically the sum of the components including the organopolysiloxane resin and the chain-like organopolysiloxane, the content of vinyl (CH2=CH—) functional groups among the curing-reactive functional group containing carbon-carbon double bonds must be, 0.05 to 1.50 mol, preferably 0.05 to 1.25 mol, and even more preferably 0.05 to 1.00 mol, per 100 g of component excluding components that are not silicone components such as functional fillers and the like. Curing-reactive functional groups include alkenyl groups having 2 to 20 carbon atoms and monovalent organic groups containing acrylic groups, such as 3-methacryloxypropyl groups and 3-acryloxypropyl groups, having a vinyl group portion in said functional group. By suppressing the content of these curing reactive functional groups, even if a large amount of functional filler is blended into the composition in question, the cured product has the advantage of having high stress relief properties.

[Hot-Melt Properties and Composition of Curable Silicone Compositions] The curable silicone composition of the present invention has hot-melt properties as an entire composition, has a softening point of 50° C. or higher, has a melt viscosity at 150° C. (suitably, a melt viscosity of less than 1,000 Pa-s), and has flowing properties. The individual components of said composition need not have hot-melt properties, and in particular, when the curing-reactive or non-reactive organopolysiloxane resin is in particulate form, it is particularly preferred that these components do not have hot-melt properties at a temperature below 200° C.

The curable silicone composition of the present invention may be and is preferably molded into granules, pellet, or sheet form, depending on the application thereof. Hereinafter, each component and optional component of the composition will be described. In the present invention, the term "average particle diameter" means the average particle diameter of the primary particles unless otherwise defined.

The curable silicone composition of the present invention is not restricted in the composition thereof as long as the composition contains at least the above components and the composition as a whole has hot-melt properties, but particularly preferable is a composition that comprises:

(A) 100 mass parts of an organopolysiloxane resin containing component (A1) and component (A2) in a mass ratio of 0:100 to 75:25, and component (A1) and component (A2), each having a weight average molecular weight (Mw) in the range of 2,000 to 15,000 as measured using gel permeation chromatography (GPC) using toluene as the solvent and polystyrene standards:
  (A1) An organopolysiloxane resin having no hot-melt properties as a whole molecule, having a curing-reactive functional group containing a carbon-carbon double bond in the molecule, where 20 mol % or more of the total siloxane units of the resin is siloxane units represented by $SiO_{4/2}$;
  (A2) An organopolysiloxane resin having no hot-melt properties as a whole molecule, having in the molecule no curing-reactive functional groups containing a carbon-carbon double bond, where 20 mol % or more of the total siloxane units of the resin is siloxane units represented by $SiO_{4/2}$;
(B) 10 to 100 mass parts of a straight- or branched-chain organopolysiloxane, liquid at 25° C., having in the molecule at least two curing-reactive functional groups containing a carbon-carbon double bond;

(C) one or more curing agents selected from (c1) or (c2) below, in an amount necessary to cure the composition:
  (c1) an organic peroxide;
  (c2) an organohydrogenpolysiloxane having at least two silicon-bonded hydrogen atoms in the molecule and a hydrosilylation reaction catalyst;
(D) functional filler; wherein
the amount of component (D) being in the range of 10 to 2000 mass parts relative to 100 mass parts of the sum of component (A) and component (B). Furthermore, the curable silicone composition of the present invention may optionally include (E) particles having hot-melt properties having a drip point of 50° C. or more and a melt viscosity of 10 Pas or less as measured by a rotational viscometer at 150° C. or other additives.

Each of the components and their content amount will be described below.

[Component (A)]

The curable silicone composition of the present invention comprises (A) an organopolysiloxane resin where 20 mol % or more of the total siloxane units of the resin is siloxane units represented by $SiO_{4/2}$ and such resin does not have hot-melt properties as a whole. The organopolysiloxane resin may further contain siloxane units represented by $R_3SiO_{1/2}$, $R_2SiO_{2/2}$, $RSiO_{3/2}$ (R is a monovalent organic group), or a hydroxyl group or an alkoxy group represented by $R^2O_{1/2}$ ($R^2$ is a hydrogen atom or an alkyl group having 1 to 10 carbon atoms) but suitably includes siloxane units represented by $SiO_{4/2}$ in a range of 40 mol % or more, 50 mol % or more, and in particular 40 to 90 mol % of the total siloxane units. If the content of the siloxane unit represented by $SiO_{4/2}$ is less than the lower limit described above, the technical effect of the present invention may not be achieved even if a large amount of other branched siloxane units (for example, $RSiO_{3/2}$) are included.

The (A) organopolysiloxane resin must have a weight average molecular weight (Mw) in the range of 2,000 to 15,000 as measured by gel permeation chromatography (GPC) using toluene as a solvent and polystyrene standards, as described above. Optionally, volatile components generated in the production process thereof may be removed. The volatile low molecular weight components are preferably removed from the organopolysiloxane resin. The degree of said removal is defined the same as the rate of mass loss when the resin is exposed to 200° C. for 1 hour, and it is particularly preferred that the volatile low molecular weight components are removed to the degree that the rate of mass loss as described above is 2.0 mass % or less.

The (A) organopolysiloxane resin may further be defined as comprising component (A1) and component (A2) in a mass ratio of 0:100 to 75:25, component (A1) and component (A2) having a weight average molecular weight in the range of 2,000 to 15,000 as measured by gel permeation chromatography (GPC) using toluene as a solvent and polystyrene standards and being:
  (A1) An organopolysiloxane resin having no hot-melt properties as a whole molecule, having a curing-reactive functional group containing a carbon-carbon double bond in the molecule, and 20 mol % or more of its total siloxane units is siloxane units represented by $SiO_{4/2}$; and
(A2) An organopolysiloxane resin having no hot-melt properties as a whole molecule and having no curing-reactive functional group containing a carbon-carbon double bond in the molecule, and 20 mol % or more of its total siloxane units is siloxane units represented by $SiO_{4/2}$.

Note that component (A1) is an optional constituent in component (A), and use of only component (A2) is feasible.

Although component (A) described above does not have hot-melt properties, hot-melt properties as a whole composition can be achieved by using component (A) in combination with the component (B) in a prescribed quantitative range as described. Component (A) is preferably in the form of microparticles, alone or together with other components, in which case the microparticles are preferably spherical silicone microparticles having an average primary particle diameter of 1 to 20 μm.

[(A1) Organopolysiloxane Resin Having a Curing-Reactive Functional Group]

Component (A1) is one of the base compounds of the composition, wherein 20 mol % or more of the total siloxane units is siloxane unit represented by $SiO_{4/2}$, has no hot-melt properties by itself, has a curing-reactive functional group containing a carbon-carbon double bond in the molecule, and has a weight loss rate when exposed to 200° C. for 1 hour of no more than 2.0 mass %.

Component (A1) must have a curing-reactive group having a carbon-carbon double bond within the molecule. These curing-reactive groups are hydrosilylation reactive or organic peroxide-curing functional groups, which form cured products by cross-linking reactions with other components. This type of curing-reactive group is an alkenyl group or an acrylic group, and examples thereof include alkenyl groups having from 2 to 10 carbon atoms such as vinyl groups, allyl groups, butenyl groups, pentenyl groups, hexenyl groups, and heptenyl groups; and acrylic group-containing monovalent organic groups such as 3-methacryloxypropyl groups and 3-acryloxypropyl groups. Vinyl groups or hexenyl groups are particularly preferable.

Component (A1) is an organopolysiloxane resin that does not have hot-melt properties as a whole molecule and is solid in a solvent-free state. Here, the absence of hot-melt properties means that the resin, which is component (A1), does not by itself exhibit heat-melting behavior at 200° C. or lower, and specifically means that the component does not have a softening point or melt viscosity at a temperature of 200° C. or lower. For component (A1), such physical properties are not structurally restricted, but the functional group in the organopolysiloxane resin is preferably a monovalent hydrocarbon group having 1 to 10 carbon atoms, in particular, a functional group selected from an alkyl group having 1 to 10 carbon atoms such as a methyl group, and substantially free of aryl groups such as a phenyl group. If a large amount of phenyl groups and the like are included, the component may become hot-meltable and the characteristic effect of $SiO_{4/2}$ groups to reinforce the cured product may be reduced.

Suitably, the functional group bonded to the silicon atom in component (A1) is a group selected from a methyl group and an alkenyl group such as a vinyl group, and preferably 70 to 99 mol % of all functional groups bonded to silicon atoms are methyl groups, and more preferably 80 to 99 mol % of all functional groups bonded to silicon atoms are methyl groups, and particularly preferably 88 to 99 mol % of all functional groups bonded to silicon atoms are methyl groups, and that any other functional group bonded to a silicon atom is an alkenyl group such as a vinyl group. In this range, component (A1) is not hot-meltable, and can be designed as a component that is particularly superior in coloration resistance and the like at high temperatures of the cured product thereof. A small amount of a hydroxyl group or an alkoxy group may be included in said component (A1).

Component (A1) is an organopolysiloxane resin that is solid in a solvent-free state, and is characterized in that 20 mol % or more of the total siloxane units in the molecule is siloxane units represented by $SiO_{4/2}$. Suitably, these branched siloxane units are at least 40 mol % of the total siloxane units, and in particular in the range of 40 to 90 mol %.

Suitably, component (A1) is a non-hotmelt organopolysiloxane resin represented by the following average unit formula (A1-1): $(R^1{}_3SiO_{1/2})_a(R^1{}_2SiO_{2/2})_b(R^1SiO_{3/2})_c(SiO_{4/2})_d(R^2O_{1/2})_e$ (in the formula, each $R^1$ is an independent monovalent hydrocarbon group having 1 to 10 carbon atoms, however, 1 to 12 mol % of all $R^1$ in a molecule is an alkenyl group; each $R^2$ is a hydrogen atom or an alkyl group having 1 to 10 carbon atoms; and a, b, c, d, and e are numbers satisfying the following: $0.10 \le a \le 0.60$, $0 \le b \le 0.70$, $0 \le c \le 0.80$, $0.2 \le d \le 0.65$, $0 \le e \le 0.05$, wherein $c+d>0.20$, and $a+b+c+d=1$).

In the average unit formula above, each $R^1$ is an independent monovalent hydrocarbon group having 1 to 10 carbon atoms, such as methyl, ethyl, propyl, butyl, pentyl, hexyl, heptyl, or similar alkyl group; vinyl, allyl, butenyl, pentenyl, hexenyl, or similar alkenyl group; phenyl, tolyl, xylyl, or similar aryl group; benzyl, phenethyl, or similar aralkyl group; and chloromethyl, 3-chloropropyl, 3,3,3-trifluoropropyl, or similar alkyl halide group. Furthermore, 1 to 12 mol % of all $R^1$ in one molecule is an alkenyl group, and preferably 2 to 10 mol % of all $R^1$ in one molecule is an alkenyl group. If the alkenyl group content is less than the lower limit of the range described above, the mechanical strength (hardness, and the like) of the resulting cured product may be insufficient. On the other hand, if the content of the alkenyl group is below the upper limit of the range described above, the composition containing the component can achieve favorable hot-melt performance as an entire composition. Each $R^1$ is preferably a functional group selected from an alkyl group having 1 to 10 carbon atoms such as a methyl group, an alkenyl group such as a vinyl group, or a hexenyl group, and from the viewpoint of the technical effect of the invention, the R1 preferably does not substantially contain an aryl group such as a phenyl group. If a large amount of aryl groups such as phenyl groups are contained, component (A) itself may become hot-meltable and the technical effect of the present invention may not be achieved, and in the cured product, the effect of reinforcing the cured product peculiar to $SiO_{4/2}$ groups may be reduced.

In the formula, $R^2$ is an alkyl group having a hydrogen atom or 1 to 10 carbon atoms. Examples of the alkyl group for $R^2$ include methyl, ethyl, propyl, butyl, pentyl or hexyl. The relevant functional group $R^2O_{1/2}$ containing $R^2$ corresponds to the hydroxyl group or alkoxy group in component (A).

In the formula, "a" is a number indicating the percentage of siloxane units in the general formula: $R^1{}_3SiO_{1/2}$. This number satisfies $0.1 \le a \le 0.60$, preferably $0.15 \le a \le 0.55$. "a" being at or above the lower limit of the aforementioned range, the composition containing the component, the composition as a whole, can achieve favorable hot-melt performance. On the other hand, "a" being less than or equal to the upper limit of the aforementioned range, the mechanical strength (hardness, elongation rate, and the like) of the cured product obtained is not too low.

In the formula, "b" is a number indicating the percentage of siloxane units in the general formula: $R^1{}_2SiO_{2/2}$. This number satisfies $0 \le b \le 0.70$, preferably $0 \le b \le 0.60$. b being less than or equal to the upper limit of the range, the composition containing the component can achieve favorable hot-melt performance as a whole composition and a composition with little stickiness at room temperature can be obtained.

In the formula, "c" is a number indicating the percentage of siloxane units in the general formula: $R^3SiO_{3/2}$. This number is given by $0 \leq c \leq 0.80$ and preferably satisfies $0 \leq c \leq 0.75$. c being less than or equal to the upper limit of the range, the composition containing the component can achieve favorable hot-melt performance as a whole composition and a tack-free composition with little stickiness at room temperature can be obtained. In the present invention, c may be and is preferred to be 0.

In the formula, "d" is the ratio of $SiO_{4/2}$ siloxane units and is necessarily $0.20 \leq d \leq 0.65$, and preferably is $0.25 \leq d \leq 0.65$. This is because within the above numerical range, the composition containing the component can achieve favorable hot-melt performance as a whole composition, and the resulting cured product has sufficient flexibility.

In the present invention, "c" may be 0, but it is necessary that c+d>0.20. If the value of c+d is less than the lower limit described above, favorable hot-melt performance cannot be achieved for the composition as a whole, and the technical effect of the present invention may not be sufficiently achieved.

In the formula, "e" is a number indicating the percentage of units in the general formula: $R^2O_{1/2}$, where the units are a hydroxyl group or alkoxy group bonded to a silicon atom that can be contained in the organopolysiloxane resin. This number satisfies $0 \leq e \leq 0.05$, preferably $0 \leq e \leq 0.03$. e being below the upper limit of the range, a material that achieves favorable hot-melt performance as an entire composition can be obtained. Note that, the sum of a, b, c and d, which is the sum of each siloxane unit, is equal to 1.

Component (A1) is an organopolysiloxane resin having the characteristics described above, and from the perspective of handleability, is suitably a spherical organopolysiloxane resin microparticle having an average primary particle diameter of 1 to 20 μm as measured by a laser diffraction/scattering method or the like. By using such a microparticulate component, the composition can be prepared or produced as a curable granular composition having superior workability and hot-melt properties. Here, the method of manufacturing component (A1) is not restricted, and a known method can be used.

The method of producing the microparticulate component (A1) includes, for example, a method of pulverizing the organopolysiloxane resin described above using a pulverizer, or a method of direct micronization in the presence of a solvent. The pulverizer may be, for example, but is not limited to, a roll mill, a ball mill, a jet mill, a turbo mill, or a planetary mill. Examples of a method of directly micronizing the organopolysiloxane in the presence of a solvent include, spraying by a spray dryer, or micronizing using a biaxial kneader or a belt dryer. In obtaining the microparticle component (A1), some of component (C) described below, such as a hydrosilylation reaction catalyst, may be particulated together with component (A1), but from the viewpoint of storage stability of the resulting composition, particulating a mixture having a property of curing by heating is not preferable.

In particular, by using a spray dryer or the like, component (A1) having a regular spherical shape and an average primary particle diameter of 1 to 500 μm, or suitably 1 to 20 μm, can be produced. The heating and drying temperature of the spray dryer needs to be appropriately set based on the heat resistance of the organopolysiloxane resin microparticles and the like. Note that in order to prevent secondary aggregation of the obtained microparticles, the temperature of the organopolysiloxane resin microparticles is preferably controlled below the glass transition temperature thereof. The organopolysiloxane resin microparticles thus obtained can be recovered by a cyclone, a bag filter, or the like.

Solvents may be used for the above particulation to the extent that they do not inhibit the curing reaction. Examples of the solvents include, but are not limited to, aliphatic hydrocarbons such as n-hexane, cyclohexane, and n-heptane; aromatic hydrocarbons such as toluene, xylene, and mesitylene; ethers such as tetrahydrofuran and dipropyl ether; silicones such as hexamethyldisiloxane, octamethyltrisiloxane, and decamethyltetrasiloxane; esters such as ethyl acetate, butyl acetate, and propylene glycol monomethyl ether; and ketones such as acetone, methyl ethyl ketone, and methyl isobutyl ketone.

[Component (A2)]

Component (A2) is one of the base compounds of the composition, and is an organopolysiloxane resin containing a curing-reactive functional group that independently does not have hot-melt properties. When used together with components (A1) and (B) in a prescribed quantitative range, hot-melt properties of the entire composition and the coloration resistance of the cured product are achieved. Such component (A2) is preferably in the form of microparticles, alone or together with other components (for example, component (A1), which is a non-reactive organopolysiloxane resin, and part of component (C), which is a curing agent), and is particularly preferably spherical silicone microparticles having an average primary particle diameter of 1 to 20 μm.

Component (A2) is an organopolysiloxane resin that does not have hot-melt properties as a whole molecule and is solid in a solvent-free state. Here, the absence of hot-melt properties means that the resin, which is component (A2), does not by itself exhibit heat-melting behavior, and specifically means that the resin does not have a softening point and melt viscosity. For component (A2), such physical properties are not structurally restricted, but the functional group in the organopolysiloxane resin is preferably a monovalent hydrocarbon group having 1 to 10 carbon atoms, in particular a functional group selected from an alkyl group having 1 to 10 carbon atoms such as a methyl group, and substantially free of aryl groups such as a phenyl group. If a large amount of phenyl groups and the like are included, the component may become hot-meltable and the characteristic effect of $SiO_{4/2}$ groups to reinforce the cured product may be reduced.

Component (A2) is organopolysiloxane resin microparticles which, similar to component (A1), is in solid form and where 20 mol % or more of the total siloxane units is siloxane units represented by $SiO_{4/2}$, but is characterized in that the component does not have a curing-reactive functional group containing at least one carbon-carbon double bond in the molecule. That is, component (A2) is characterized in that the component does not contain an alkenyl group such as a vinyl group as a functional group in the organopolysiloxane resin. The functional group in this organopolysiloxane is a monovalent hydrocarbon group having 1 to 10 carbon atoms, particularly an alkyl group having 1 to 10 carbon atoms such as a methyl group, and the functional group is preferably substantially free of an aryl group such as a phenyl group.

The functional group bonded to the silicon atom in component (A2) is suitably an alkyl group with 1 to 10 carbon atoms such as a methyl group, and 70 to 100 mol % of all functional groups bonded to the silicon atoms are preferably methyl groups, more preferably 80 to 100 mol % are methyl groups, and particularly preferably 88 to 100 mol % are methyl groups. In such a range, component (A2) can be designed as a component that is not hot-meltable and that is particularly effective in reinforcing the cured product by containing siloxane units represented by $SiO_{4/2}$. A small amount of a hydroxyl group or an alkoxy group may be included in said component (A2).

Since component (A2) does not have a curing-reactive group having a carbon-carbon double bond in the molecule, the component does not form a cured product by itself. However, the component has a reinforcing effect on the cured product and improves the hot-melt properties of the composition as a whole. It may be used as needed in combination with component (A1) having a curing-reactive group, and this is necessary to achieve the technical effect of the present invention.

Component (A2) is an organopolysiloxane resin that is solid in a solvent-free state, and contains a siloxane unit that is a branching siloxane unit represented by $SiO_{4/2}$ making up 20 mol % or more of the total siloxane units in the molecule. Suitably, such siloxane units are at least 40 mol %, preferably 50 mol % or more, and particularly preferably in the range of 50 to 65 mol % of the total siloxane units.

Suitably, component (A2) is an organopolysiloxane resin not having any hot-melt properties represented by the following average unit formula (A2-1): $(R^3{}_3SiO_{1/2})_f(R^3{}_2SiO_{2/2})_g(R^3SiO_{3/2})_h(SiO_{4/2})_i(R^2O_{1/2})_j$ (in the formula, each $R^3$ is an independent monovalent hydrocarbon group having 1 to 10 carbon atoms and not containing a carbon-carbon double bond; $R^2$ is a hydrogen atom or an alkyl group having 1 to 10 carbon atoms; and f, g, h, i, and j are numbers satisfying the following: $0.35 \leq f \leq 0.55$, $0 \leq g \leq 0.20$, $0 \leq h \leq 0.20$, $0.45 \leq i \leq 0.65$, $0 \leq j \leq 0.05$, and $f+g+h+i=1$).

In the above average unit formula, each $R^3$ independently has from 1 to 10 carbon atoms, and is a monovalent hydrocarbon group that does not contain any carbon-carbon double bonds, such as methyl, ethyl, propyl, butyl, pentyl, hexyl, heptyl, or similar alkyl group; phenyl, tolyl, xylyl, or similar aryl group; benzyl, phenethyl, or similar aralkyl group; and chloromethyl, 3-chloropropyl, 3,3,3-trifluoropropyl, or similar alkyl halide group; and the like. Herein, from the viewpoint of industrial production and the technical effect of the invention, 70 mol % or more of all $R^3$ in one molecule is preferably an alkyl group having 1 to 10 carbon atoms, such as a methyl group, and particularly preferably 88 mol % or more is a methyl group. On the other hand, $R^3$ is preferably substantially free of an aryl group such as a phenyl group. If a large amount of aryl groups such as phenyl groups are contained, component (B) itself may become hot-meltable and the technical effect of the present invention may not be achieved, and the coloration resistance of the cured product at high temperatures may deteriorate.

In the formula, $R^2$ is synonymous with the groups described above.

In the formula, "f" is a number indicating the percentage of siloxane units in the general formula: $R^3{}_3SiO_{1/2}$. This number satisfies $0.35 \leq f \leq 0.55$, preferably $0.40 \leq f \leq 0.50$. "f" being at or above the lower limit of the aforementioned range, the composition containing the component, the composition as a whole, can achieve favorable hot-melt performance. On the other hand, "f" being less than or equal to the upper limit of the aforementioned range, the mechanical strength (hardness, and the like) of the cured product obtained is not too low.

In the formula, "g" is a number indicating the percentage of siloxane units in the general formula: $R^1{}_2SiO_{2/2}$. This number satisfies $0 \leq g \leq 0.20$, preferably $0 \leq g \leq 0.10$. "g" being less than or equal to the upper limit of the range, the composition containing the component can achieve favorable hot-melt performance as a whole composition and a composition with little stickiness at room temperature can be obtained. In the present invention, "g" may be and is preferred to be 0.

In the formula, "h" is a number indicating the percentage of siloxane units in the general formula: $R1_3SiO_{3/2}$. This number satisfies $0 \leq h \leq 0.20$, preferably $0 \leq h \leq 0.10$. "h" being less than or equal to the upper limit of the range, the composition containing the component can achieve favorable hot-melt performance as an entire composition and a composition with little stickiness at room temperature can be obtained. In the present invention, "h" may be and is preferred to be 0.

In the formula, "i" is a number indicating the ratio of $SiO_{4/2}$ siloxane units where $0.45 \leq i \leq 0.65$, and $0.40 \leq d \leq 0.65$ is preferable, and $0.50 \leq d \leq 0.65$ is particularly preferable. Within this numerical range, the composition containing this component can achieve favorable hot-melt performance as a whole, superior mechanical strength of the resulting cured product, and favorable workability without stickiness as an entire composition.

In the formula, "j" is a number indicating the percentage of units in the general formula: $R^2O_{1/2}$, wherein the units are a hydroxyl group or an alkoxy group bonded to a silicon atom that can be contained in the organopolysiloxane resin. This number satisfies $0 \leq j \leq 0.05$, preferably $0 \leq j \leq 0.03$. "j" being below the upper limit of the range, a material that achieves favorable hot-melt performance as an entire composition can be obtained. Note that, the sum of, f, g, h, i which is the sum of each siloxane unit, is equal to 1.

Component (A2) is an organopolysiloxane resin having the characteristics described above, and from the perspective of handleability, is preferably a spherical organopolysiloxane resin microparticle having an average primary particle diameter of 1 to 20 μm as measured by a laser diffraction/scattering method or the like. By using such a microparticulate component, the composition can be prepared or produced as a curable granular composition having superior workability and hot-melt properties. Herein, the method for manufacturing component (A2) include the same methods as those indicated for component (A1) above.

[Removal of Volatile Low Molecular Weight Components in Component (A)]

In the production process of component (A1) and component (A2), volatile low molecular weight components are generated. Specifically, these have a structure of $M_4Q$ and appear as byproducts when polymerizing an organopolysiloxane resin made up of an M unit ($R^3{}_3SiO_{1/2}$) and a Q unit ($SiO_{4/2}$). The components with this structure have the effect of significantly reducing the hardness of the cured product consisting of the composition of the present invention. The organopolysiloxane resin used herein is polymerized in the presence of a highly co-soluble organic solvent, and the organic solvent is removed by drying under reduced pressure or the like, to obtain a solid organopolysiloxane resin. However, the $M_4Q$-structured components have high mutual solubility with the organopolysiloxane resin, and cannot be removed by drying conditions that remove the organic solvent. It is known that these components can be removed by exposure to a temperature of 200° C. or higher for a short period of time. However, if these components is removed by exposure to a high temperature after integral molding with a substrate of a semiconductor and such, the volume of the cured product decreases and the hardness of the cured product increases remarkably, causing the dimensions of the molded material to change and warping to occur. Therefore, the M₄Q-structured components must be removed before the molding process with the substrate, in other words, while a raw material, in order to apply to an application of the present invention.

Examples of methods for removing the structure include a method of removing together with the aforementioned organic solvent using a biaxial kneader and a method of providing a particulate organopolysiloxane based on the method described below and then removing through drying in an oven or the like.

More specifically, the component (A1) and component (A2) are produced in the presence of organic solvents, and volatile components appear as byproducts during synthesis. Since the volatile components can be removed by briefly treating the obtained organopolysiloxane resin that is still a coarse raw material at a high temperature of roughly 200° C., the organic solvent and volatile components can simultaneously be removed from component (A1) and component (A2) using a biaxial kneader set at roughly 200° C. When component (A1) and component (A2) are handled as spherical powders, the components can be converted into powder by removing the organic solvent with a spray dryer, but the volatile components can not be removed using this method. If the resulting powder is treated at a low temperature of about 120° C. for 24 hours, the volatile components can be removed without agglomeration of the powder.

[Mass Ratio of Component (A1) and Component (A2) in Component (A)]

In order to impart hot-melt properties to the composition as a whole, the component (A2) or a mixture of the component (A1) and the component (A2) must be mixed with component (B) described below in a prescribed ratio, where the ratio of component (A) to component (B) may be in the range of 0:100 to 75:25, preferably in the range of 0:100 to 60:40, and more preferably in the range of 0:100 to 55:45. The component (A2) is not itself curable, but by adding a small amount of component (A1) and using in combination with the component (A2) in this composition, the elastic modulus at high temperatures of the cured product produced from this composition can be controlled. When the functional inorganic filler described below is added to the composition, by suitably adjusting the amount of the filler and the amount of component (A1) used, an appropriate elastic modulus and flexibility can be achieved. For example, when the amount of functional inorganic filler added is large or when reducing the elastic modulus of the cured product obtained to the extent possible is desired, the composition can be blended with only the component (A2) and not adding component (A1).

[Component (B)]

Component (B) is one of the base compounds of the present composition, and is a straight- or branched-chain organopolysiloxane that is liquid at 25° C. and has at least two curing-reactive functional group containing a carbon-carbon double bond in the molecule. These curing-reactive chain-like organopolysiloxanes, when mixed with the aforementioned solid organopolysiloxane resin, confers hot-melt properties to the entire composition.

Component (B) must have a curing-reactive group having a carbon-carbon double bond in the molecule. Such curing-reactive group is hydrosilylation reactive or organic peroxide-curing functional group that forms a cured product based on a crosslinking reaction with other components. Such curing-reactive group is an alkenyl group or an acrylic group, and examples are the same groups described above, and a vinyl group or a hexenyl group are in particular preferable.

Component (B) is a straight- or branched-chain organopolysiloxane in a liquid state at 25° C. (room temperature), and when mixed with component (A) in a solid state at room temperature, the composition as a whole exhibits hot-melt-ability. The structure of the composition may be based on a branched-chain organopolysiloxane having a small number of branching siloxane units (for example, T units represented by the general formula: $R^4SiO_{3/2}$ ($R^4$ is independently a monovalent hydrocarbon group having 1 to 10 carbon atoms) or Q units represented by $SiO_{4/2}$), but preferably a straight-chain organopolysiloxane (B1) represented by the following structural formula

$R^4{}_3SiO(SiR^4{}_2O)_kSiR^4{}_3$ (In the formula, each $R^4$ is independently a monovalent hydrocarbon group having 1 to 10 carbon atoms, except that at least two of the $R^4$ in one molecule is an alkenyl group, and k is a number from 20 to 5,000).

Preferably, a straight-chain diorganopolysiloxane capped at both molecular terminals with one alkenyl group each is preferred.

In the formula, each $R^4$ is independently a monovalent hydrocarbon group having 1 to 10 carbon atoms, such as methyl, ethyl, propyl, butyl, pentyl, hexyl, heptyl, or similar alkyl group; vinyl, allyl, butenyl, pentenyl, hexenyl, or similar alkenyl group; phenyl, tolyl, xylyl, or similar aryl group; benzyl, phenethyl, or similar aralkyl group; and chloromethyl, 3-chloropropyl, 3,3,3-trifluoropropyl, or similar alkyl halide group. Furthermore, at least two of the $R^4$ in one molecule are alkenyl groups, preferably a vinyl group. Each $R^4$ is also preferably a functional group selected from an alkyl group having 1 to 10 carbon atoms such as a methyl group, an alkenyl group such as a vinyl group, or a hexenyl group, and it is particularly preferable that of all $R^4$, at least two are alkenyl groups, and the remaining $R^4$ are methyl groups. Note, from the viewpoint of the technical effect of the invention, the $R^4$ is preferably substantially free of an aryl group such as a phenyl group. If a large amount of aryl groups such as phenyl groups are contained therein, the coloration resistance of the cured product at high temperatures may deteriorate. Particularly suitable is having an alkenyl group such as a vinyl group at both molecular terminals, the rest of the $R^4$ being methyl groups.

In the formula, "k" is a number between 20 and 5,000, preferably between 100 and 3,000, and particularly preferably between 300 and 1500. "k" being at or above the lower limit of the aforementioned range, a composition having little stickiness at room temperature can be obtained. On the other hand, "k" being below the upper limit of the aforementioned range, the composition as a whole can achieve favorable hot-melt performance. Further, a curing-reactive chain-like organopolysiloxane having a relatively large degree of polymerization and a high molecular weight as described above is preferably selected for component (B). This is because the use of component (B) having a low molecular weight tends to reduce the toughness and stress relief properties of the resulting cured product, depending on the type and amount of functional filler, even when component (A) described above is used, and the cured product may become noticeably embrittled when the amount of functional inorganic filler is very high. Therefore, in order to prevent high hardness and embrittlement of the cured product, especially when a large amount of inorganic filler is blended into the curable silicone composition, combining of (A) an organopolysiloxane resin in the above molecular weight range with (B) a component having a relatively high molecular weight is suitable.

Here, in order to achieve hot-melt properties as an entire composition, the mass ratio of component (B), which is a straight- or branched-chain organopolysiloxane, relative to 100 mass parts of component (A), which is an organopolysiloxane resin, is in the range of 10 to 100 mass parts, preferably in the range of 10 to 70 mass parts and more preferably in the range of 15 to 50 mass parts. If the content of component (B) is in the range described above, the composition can achieve favorable hot-melt properties and the mechanical strength of the resulting cured product can be increased, and the stickiness of the resulting composition can be reduced at room temperature, thereby improving the workability thereof.

[Component (C)]

Component (C) is a curing agent for curing component (A) and component (B) described above, and is specifically one or more curing agents selected from (c1) or (c2) below. Two or more of these curing agents may be used in combination, for example, the cure system may include both a (c1) component and a (c2) component:

(c1) an organic peroxide;

(c2) an organohydrogenpolysiloxane having at least two silicon-bonded hydrogen atoms in the molecule and a hydrosilylation reaction catalyst.

(c1) Organic peroxide is a component that cures component (A) and component (B) described above by heating, and examples include alkyl peroxides, diacyl peroxides, ester peroxides, and carbonate peroxides. Component (c1) can also react with some of the (A2) components.

Examples of alkyl peroxides include dicumyl peroxide, di-tert-butyl peroxide, di-tert-butylcumyl peroxide, 2,5-dimethyl-2,5-di(tert-butylperoxy)hexane, 2,5-dimethyl-2,5-di(tert-butylperoxy)hexyne-3, tert-butylcumyl, 1,3-bis(tert-butylperoxyisopropyl)benzene, and 3,6,9-triethyl-3,6,9-trimethyl-1,4,7-triperoxonan.

Examples of diacyl peroxides include benzoyl peroxide, lauroyl peroxide, and decanoyl peroxide.

Examples of ester peroxides include 1,1,3,3-tetramethylbutylperoxyneodecanoate, α-cumylperoxyneodecanoate, tert-butylperoxyneodecanoate, tert-butylperoxyneoheptanoate, tert-butylperoxypivalate, tert-hexylperoxypivalate, 1,1,3,3-tetramethylbutylperoxy-2-ethylhexanoate, tert-amylperoxyl-2-ethylhexanoate, tert-butylperoxy-2-ethylhexanoate, tert-butylperoxyisobutyrate, di-tert-butylperoxyhexahydroterephthalate, tert-amylperoxy-3,5,5-trimethylhexanoate, tert-butylperoxy-3,5,5-trimethylhexanoate, tert-butylperoxyacetate, tert-butylperoxybenzoate, and di-butylperoxytrimethyladipate.

Examples of carbonate peroxides include di-3-methoxybutyl peroxydicarbonate, di(2-ethylhexyl)peroxydicarbonate, diisopropyl peroxycarbonate, tert-butyl peroxyisopropylcarbonate, di(4-tert-butylcyclohexyl)peroxydicarbonate, dicetyl peroxydicarbonate, and dimyristyl peroxydicarbonate.

This organic peroxide preferably has a 10-hour half-life temperature of not lower than 90° C. or not lower than 95° C. Examples of such organic peroxide include dicumyl peroxide, di-tert-butyl peroxide, di-tert-hexyl peroxide, tert-butylcumyl peroxide, 2,5-dimethyl-2,5-di(tert-butylperoxy)hexane, 1,3-bis(tert-butylperoxyisopropyl)benzene, di-(2-tert-butylperoxyisopropyl)benzene, and 3,6,9-triethyl-3,6,9-trimethyl-1,4,7-triperoxonan.

(c1) While not limited thereto, the content of the organic peroxide is preferably within the range of 0.05 to 10 mass parts, or within the range of 0.10 to 5.0 mass parts, with regards to 100 mass parts of component (A) and component (B).

(c2) The organohydrogenpolysiloxane having at least two silicon-bonded hydrogen atoms in the molecule and the hydrosilylation reaction catalyst are components that cure the composition by an addition reaction (hydrosilylation reaction) of the organohydrogenpolysiloxane, a crosslinking agent, with the carbon-carbon double bond in component (A) and component (C) in the presence of the hydrosilylation reaction catalyst.

The structure of the crosslinking agent, organohydrogenpolysiloxane, is not particularly limited and may be straight-chain, branched-chain, cyclic, or resinous. In other words, component (c2) may be an organohydrogenpolysiloxane having, as the main constituent unit, a hydrogen organosiloxy unit represented by $HRSiO_{2/2}$ ($D^H$ unit, wherein R is independently a monovalent organic group), and at the end thereof a hydrogen diorganosiloxy unit represented by $HR_2SiO_{1/2}$ ($M^H$ unit, wherein R is independently a monovalent organic group). In particular, in the case of applications other than the molding process described below, even if the curable silicone composition is a chain-like organohydrogenpolysiloxanes made up of the $D^H$ units described above, or the like, sufficient curing is possible for practical use.

On the other hand, when the curable silicone composition is used in a molding process, since the content of the curable reactive functional group containing a carbon-carbon double bond in the composition is small, from the viewpoint of curing speed, moldability, and curing properties thereof, the organohydrogenpolysiloxane that contains branching units a monoorganosiloxy unit represented by $RSiO_{3/2}$ (T unit, wherein R is a monovalent organic group or a silicon-bonded hydrogen atom) or a siloxy unit (Q unit) represented by $SiO_{4/2}$, and at least two hydrogen diorganosiloxy units represented by $HR_2SiO_{1/2}$ ($M^H$ unit, where R is independently a monovalent organic group), and has $M^H$ unit at the molecular terminal is preferred.

A particularly suitable organohydrogenpolysiloxane is an organohydrogenpolysiloxane resin represented by the following average unit formula:

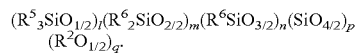

In the formula, each $R^5$ is the same or different monovalent hydrocarbon group having 1 to 10 carbon atoms without an aliphatic unsaturated carbon bond or hydrogen atom, wherein at least two $R^5$ in one molecule are hydrogen atoms. Examples of the monovalent hydrocarbon group $R^5$ include methyl, ethyl, propyl, butyl, pentyl, hexyl, heptyl, or similar alkyl group; phenyl, tolyl, xylyl, or similar aryl group; benzyl, phenethyl, or similar aralkyl group; and chloromethyl, 3-chloropropyl, 3,3,3-trifluoropropyl, or similar alkyl halide group; and the like. From an industrial viewpoint, methyl groups or phenyl groups are preferred.

In the formula, $R^6$ is a monovalent hydrocarbon group having 1 to 10 carbon atoms without an aliphatic unsaturated carbon bond, for example, the same group as the monovalent hydrocarbon group described above. On the other hand, $R^2$ is a hydrogen atom or an alkyl group having 1 to 10 carbon atoms, for example, $R^2$ in the above component (A1) or component (A2).

In the formula, l, m, n and p are numbers that satisfy the following: $0.1 \leq l \leq 0.80$, $0 \leq m \leq 0.5$, $0 \leq n \leq 0.8$, $0 \leq p \leq 0.6$, $0 \leq q \leq 0.05$, wherein $n+p > 0.1$ and $l+m+n+p=1$. Here, when the present composition is used in the molding process, the organohydrogenpolysiloxanes resin that is part of component (c2) are specifically preferred to be $M^HMT$ resin, $M^HMTT^H$ resin, $M^HMTQ$ resin, $M^HMQ$ resin, $M^HMTT^HQ$, or $M^HQ$ resin.

Particularly suitable as the organohydrogenpolysiloxane which is part of component (c2) is a $M^HQ$ resin represented by (c2-1) $(H(CH_3)_2SiO_{1/2})_{l1}(SiO_{4/2})_{p1}$.

Here, $l1+p1=1$, and it is preferable to have $0.1 \leq l1 \leq 0.80$ and $0.20 \leq p1 \leq 0.90$.

Similarly, the organohydrogenpolysiloxane that is part of component (c2) may include straight-chain diorganopolysiloxane, organohydrogenpolysiloxane, or diorganopolysiloxane whose molecular chain ends are capped by silicon-bonded hydrogen atoms or trimethylsiloxy groups. The degree of polymerization of siloxane of these straight-chain organohydrogenpolysiloxanes is not particularly limited, but is in the range of 2 to 200, and is preferably in the range of 5 to 100.

The amount of the organohydrogenpolysiloxane, which is a part of component (c2), is an amount sufficient to cure the curable silicone composition of the present invention and relative to the curing reactive functional group containing a carbon-carbon double bond (for example, an alkenyl group such as a vinyl group) in component (A) and (B), the molar ratio of the silicon-bonded hydrogen atom in the organohydrogenpolysiloxane is 0.5 or more and preferably in the range of 0.5 to 20. In particular, when component (c2) includes the organohydrogenpolysiloxane resin described above, the amount thereof is set so that, relative to the curing reactive functional group containing a carbon-carbon double bond in component (A) and component (B), the molar ratio of the silicon-bonded hydrogen atom in the organohydrogenpolysiloxane resin is in the range of 0.5 to 20 and preferably in the range of 1.0 to 10.

Examples of the catalyst for the hydrosilylation reaction that is a part of component (c2) include platinum-based catalysts, rhodium-based catalysts, and palladium-based catalysts. Platinum-based catalysts are preferred due to the ability to remarkably promote curing of the present composition. Examples of platinum-based catalysts include platinum fine powder, chloroplatinic acid, an alcohol solution of chloroplatinic acid, a platinum-alkenyl siloxane complex, a platinum-olefin complex, a platinum-carbonyl complex, and a catalyst in which these platinum-based catalysts are dispersed or encapsulated with a thermoplastic resin such as silicone resin, polycarbonate resin, acrylic resin or the like, with a platinum-alkenyl siloxane complex being particularly preferable. Examples of alkenylsiloxanes include: 1,3-divinyl-1,1,3,3-tetramethyldisiloxane; 1,3,5,7-tetramethyl-1,3,5,7-tetravinylcyclotetrasiloxane; alkenyl siloxanes obtained by substituting a portion of methyl groups of the alkenylsiloxanes with an ethyl group, a phenyl group, or the like; and alkenylsiloxanes obtained by substituting a portion of vinyl groups of these alkenylsiloxanes with an allyl group, a hexenyl group, or the like. In particular, 1,3-divinyl-1,1,3,3-tetramethyldisiloxane is preferably used because of the favorable stability of this platinum-alkenylsiloxane complex, and is preferably added in the form of a complex alkenylsiloxane solution. In addition, in terms of improving the workability as well as the pot life of the composition, a platinum containing hydrosilylation reaction catalyst in microparticulate dispersed and encapsulated with thermoplastic resin may be used. A non-platinum based metal catalyst such as iron, ruthenium, iron/cobalt, or the like may be used as the catalyst for promoting the hydrosilylation reaction.

The amount of the catalyst for hydrosilylation reaction, which is a part of component (c2), should be an amount in which a metal atom is in the range of 0.01 to 500 ppm, 0.01 to 100 ppm, or preferably 0.01 to 50 ppm in terms of mass units relative to the entire composition.

Particularly suitable component (c2) comprises an organohydrogenpolysiloxane resin represented by the average unit formula (c2-1) described above and a hydrosilylation reaction catalyst.

When the hydrosilylation reaction catalyst described above is used as a part of component (C), its inclusion in the organopolysiloxane microparticles such as component (A1) and component (A2) when they are produced is preferable from the viewpoint of the storage stability of this curable silicone composition. However, the mixture comprising the microparticles preferably should not become curing reactive on its own.

[Component (D)]

The functional filler, which is component (D), is an essential element of the present invention, and is a component that imparts mechanical and other properties to the cured product, and indicated by inorganic fillers, organic fillers, and mixtures thereof. Examples of the inorganic fillers include a reinforcing filler, a white pigment, a thermally conductive filler, an electrically conductive filler, a phosphor, and mixtures of at least two of these, and examples of organic fillers include a silicone resin filler, a fluorine resin filler, and a polybutadiene resin filler. The shape of these fillers is not particularly limited, and may be spherical, spindle-shaped, flat, needle-shaped, amorphous, or the like.

When the present composition is used in applications as an encapsulant, a protective agent, an adhesive and the like, a reinforcing filler is preferably included in at least a part of component (D) from the viewpoint of improving the mechanical strength, protectiveness, and adhesiveness of the cured product.

Reinforcing fillers may be added to improve the mechanical strength of the cured product, to improve protection and adhesion, and to maintain a solid particle shape as a binder filler in the curable silicone composition before curing. Examples of this type of reinforcing filler include fumed silica, precipitated silica, fused silica, calcined silica, fumed titanium dioxide, quartz, calcium carbonate, diatomaceous earth, aluminum oxide, aluminum hydroxide, zinc oxide, and zinc carbonate. These reinforcing fillers may also be surface-treated with organoalkoxysilanes such as methyltrimethoxysilane; organohalosilanes such as trimethylchlorosilane; organosilazanes such as hexamethyldisilazane; siloxane oligomers such as dimethylsiloxane oligomers capped with $\alpha,\omega$-silanol groups, methylphenylsiloxane oligomers capped with $\alpha,\omega$-silanol groups, methylvinylsiloxane oligomers capped with $\alpha,\omega$-silanol groups, or the like. The particle size of the reinforcing filler is not restricted, but the median diameter measured by a laser diffraction scattering type particle size distribution measurement is preferably within a range of 1 nm to 500 μm. Further, as the reinforcing filler, a fibrous filler such as calcium metasilicate, potassium titanate, magnesium sulfate, sepiolite, zonolite, aluminum borate, rock wool, glass fiber, or the like may be used.

Further, a white pigment, a thermally conductive filler, an electrically conductive filler, or a phosphor may be blended for the purpose of imparting other functions to the cured product obtained using the composition. Organic fillers such as silicone elastomer microparticles may also be blended for the purpose of improving the stress relief properties of the cured product.

A white pigment is a component that imparts whiteness to the cured product and improves light reflectivity, and the cured product resulting from curing the composition by blending this component can be used as a light reflective material for light emitting/optical devices. Examples of the white pigment include metal oxides such as titanium oxide, aluminum oxide, zinc oxide, zirconium oxide, magnesium oxide, and the like; hollow fillers such as glass balloons, glass beads, and the like; and additionally, barium sulfate, zinc sulfate, barium titanate, aluminum nitride, boron nitride, and antimony oxide. Titanium oxide has high optical reflectivity and concealing properties, and is therefore preferable. Furthermore, aluminum oxide, zinc oxide, and barium titanate have high optical reflectivity of a UV region, and are therefore preferable. The average particle size or shape of the white pigment is not restricted, but the average particle diameter is within a range of 0.05 to 10.0 μm and preferably within a range of 0.1 to 5.0 μm. Furthermore, white pigment can be surface-treated using a silane coupling agent, silica, aluminum oxide, and the like.

A thermally conductive filler or an electrically conductive filler is added for the purpose of imparting thermal conductivity/electrical conductivity to the cured product, and specific examples include a metallic fine powder such as gold, silver, nickel, copper, or aluminum; a fine powder such as ceramic, glass, quartz or organic resin, the surface thereof on which a metal such as gold, silver, nickel, or copper is deposited or plated; a metallic compound such as aluminum oxide, magnesium oxide, aluminum nitride, boron nitride or zinc oxide or the like; and graphite, and mixtures of two or more of these. When electrical insulation is required for the present composition, a metal oxide-based powder or a metal nitride-based powder is preferable, and in particular, an aluminum oxide powder, a zinc oxide powder, or an aluminum nitride powder is preferable and combinations of type, particle diameter, and particle shape and the like can be used according to these thermal conductivity/electrical conductivity requirements.

Phosphor is a component that is blended when the cured product is used as a wavelength conversion material to convert the emission wavelength from a light source (optical semiconductor device). There is no particular limitation on such phosphors, and examples of the phosphor include yellow, red, green, and blue light phosphors, which include oxide phosphors, oxynitride phosphors, nitride phosphors, sulfide phosphors, oxysulfide phosphors, and the like, which are widely used in light emitting diodes (LED).

Silicone microparticles include non-reactive silicone resin microparticles and silicone elastomer microparticles, but silicone elastomer microparticles are suitably exemplified from the viewpoint of improving cured product flexibility or stress relief properties.

The silicone elastomer microparticles are a crosslinked product of straight-chain diorganopolysiloxane made up primarily of diorganosiloxy units (D units $R_2SiO_{2/2}$). The silicone elastomer microparticles can be prepared by a crosslinking reaction of diorganopolysiloxane by a hydrosilylation reaction or a condensation reaction of a silanol group, or the like, and in particular, the silicone elastomer microparticles can be suitably obtained by a crosslinking reaction of organohydrogenpolysiloxane having a silicon-bonded hydrogen atom at a side chain or a terminal with diorganopolysiloxane having an unsaturated hydrocarbon group such as an alkenyl group at a side chain or a terminal in the presence of a hydrosilylation reaction catalyst. The silicone elastomer microparticles may have various shapes such as spherical, flat, and irregular shapes, but spherical form is preferred in terms of dispersibility, and among these, true spherical is more preferable. Commercial products of such silicone elastomer microparticles include, for example, "Torefil-E series" and "EP Powder series" manufactured by Dow Toray Company, Ltd., and "KMP series" manufactured by Shin-Etsu Chemical Co., Ltd.

For the purpose of stably blending the functional filler described above in the present composition and such, the filler surface may be treated using a specific surface treatment agent in the range of 0.1 to 2.0 mass %, 0.1 to 1.0 mass %, or 0.2 to 0.8 mass % of the total mass of component (D). Examples of these surface treatment agents include, methylhydrogen polysiloxane, silicone resins, metal soaps, silane coupling agents, perfluoroalkyl silanes, as well as fluorine compounds such as perfluoroalkyl phosphate ester salts.

In particular, when component (D) is a thermally conductive filler, and is blended in large quantities into the curable silicone composition of the present invention, the thermally conductive filler is suitably a plate-shaped boron nitride powder having an average particle diameter of 0.1 to 30 μm, a granular boron nitride powder having an average particle diameter of 0.1 to 50 μm, a spherical and/or crushed aluminum oxide powder having an average particle diameter of 0.01 to 50 μm, or spherical and/or crushed graphite having an average particle diameter of 0.01 to 50 μm, or a mixture of two or more of these. A mixture of two or more types of spherical or crushed aluminum oxide powders having an average particle diameter of 0.01 to 50 μm is most suitable. In particular, the combination of aluminum oxide powders with large particle size and small particle size in the ratio following the maximum packing theoretical distribution curve improves the packing efficiency and enables low viscosity and high thermal conductivity.

Furthermore, said thermally conductive filler is particularly preferred to have at least part of the surface thereof treated with one or more organosilicon compounds. The suitable range of the processing amount is as described above. Examples of organic silicon compounds that are surface treatment agents are low molecular weight organosilicon compounds such as silanes, silazanes, siloxanes, or the like, and organosilicon polymers or oligomers such as polysiloxanes, polycarbosiloxanes, or the like. A so-called silane coupling agent is an example of a preferred silane. Typical examples of the silane coupling agents include alkyltrialkoxysilanes (such as methyltrimethoxysilane, vinyltrimethoxysilane, hexyltrimethoxysilane, octyltrimethoxysilane, and decyltrimethoxysilane, and the like) and trialkoxysilanes containing an organic functional group (such as glycidoxypropyltrimethoxysilane, epoxycyclohexyl ethyltrimethoxysilane, methacryloxypropyltrimethoxysilane, aminopropyltrimethoxysilane, and the like). Preferred siloxanes and polysiloxanes include hexamethyldisiloxanes, 1,3-dihexyl-tetramethyldisiloxanes, trialkoxysilyl single-terminated polydimethylsiloxanes, trialkoxysilyl single-terminated dimethylvinyl single-terminated polydimethylsiloxanes, trialkoxysilyl single-terminated organic functional group single-terminated polydimethylsiloxanes, trialkoxysilyl doubly-terminated polydimethylsiloxanes, organic functional group doubly-terminated polydimethylsiloxanes, and the like. When a siloxane is used, the number n of siloxane bonds is preferably within a range of 2 to 150. Examples of preferred silazanes include hexamethyldisilazanes, 1,3-dihexyl-tetramethyldisilazanes, and the like. A polymer having an Si—C—C—Si bond in a polymer main chain is an example of a preferred polycarbosiloxane.

The amount of component (D) is not restricted, but the amount is preferably within a range of 10 to 2,000 mass parts, within a range of 10 to 1500 mass parts, or within a range of 10 to 1000 mass parts relative to the sum of component (A) and component (B) (100 mass parts) in order for the obtained cured product to have superior hardness and mechanical strength.

Since the curable silicone composition of the present invention has the advantage that the toughness and stress relief properties of the cured product obtained are not impaired even if a large amount of the functional inorganic filler is blended in, functional filler such as alumina or the like can be, and is preferably blended into the composition in the range of 100 to 2000 mass parts, in the range of 150 to 1500 mass parts, or in the range of 300 to 1200 mass parts relative to the sum of component (A) and component (b) (100 mass parts).

The curable silicone composition of the present invention comprises components (A) to (D) described above, and from the viewpoint of further improving the melting properties thereof, (E) hot-melt particles with a drip point of 50° C. or higher and a melt viscosity measured by a rotational viscometer at 150° C. of less than 10 Pas may be added and is preferable.

The type of component (E) is not particularly limited as long as the conditions of the drip point described above and kinematic viscosity at 150° C. during melting are satisfied, and one or more types selected from various hot-melt synthetic resins, waxes, fatty acid metal salts, and the like can be used. Component (E) exhibits low kinematic viscosity at high temperatures (150° C.) and forms a melt with superior flowability. Furthermore, by combining the components (A) to (C) described above, component (E) in the melt that makes up the present composition spreads quickly throughout the composition at high temperature, thereby lowering the viscosity between the substrate surface to which the molten composition is applied and the entire composition, rapidly lowering the surface friction of the substrate and the molten composition, and significantly increasing the fluidity of the entire composition. Therefore, the viscosity and flowability of the molten composition can be greatly improved by adding only a very small amount of component (E) to the total amount of other components.

Component (E) can be a petroleum wax, such as a paraffin, as long as the kinetic viscosity requirements for the drip point and while melted described above are satisfied. However, from the viewpoint of the technical effect of the present invention, the hot-melt component preferably is made up of a fatty acid metal salt, or an erythritol derivative fatty acid ester and metal salts of higher fatty acids such as stearic acid, palmitic acid, oleic acid, isononanoic acid and the like, orpentaerythritol tetrastearate, dipentaerythritol adipic acid stearate, glycerintri-18-hydroxystearate, pentaerythritol full stearate are particularly preferred. Here, the types of the fatty acid metal salts described above are also not particularly limited, and suitable examples include alkali metal salts such as lithium, sodium, potassium, and the like; alkaline earth metal salts such as magnesium, calcium, barium, and the like; or zinc salts.

Particularly suitable as component (E) are (E0) fatty acid metal salts having a free fatty acid content of 5.0% or less, 4.0% or less, and 0.05 to 3.5% fatty acid metal salts and erythritol derivatives. Examples of such a component include at least one or more stearic acid metal salts. The use of a hot-melt component having a melting point of 150° C. or less, selected from the following is most preferred, specifically, calcium stearate (melting point 150° C.), zinc stearate (melting point 120° C.), and magnesium stearate (melting point 130° C.) pentaerythritol tetrastearate (melting point 60-70° C.), pentaerythritol adipate stearate (melting point 55-61° C.), pentaerythritol full stearate (melting point 62-67° C.) and the like.

Regarding the amount of component (E) used, with the entire composition taken as 100 mass parts, the content of component (E0) is in the range of 0.01 to 5.0 mass parts, and may be 0.01 to 3.5 mass parts or 0.01 to 3.0 mass parts. If the amount of the component (E) used exceeds the upper limit, the adhesiveness and mechanical strength of the cured product obtained from the curable silicone composition of the present invention may be insufficient. If the amount of component (E) used is less than the lower limit, sufficient fluidity while heating and melting may not be achieved.

The present composition may contain a curing retardant or an adhesion imparting agent as other optional components as long as the object of the present invention is not impaired.

Examples of the curing retardant include: alkyne alcohols such as 2-methyl-3-Butyn-2-ol, 3,5-dimethyl-1-hexyn-3-ol, 2-phenyl-3-butyn-2-ol, and 1-ethynyl-1-cychlohexanol; enyne compounds such as 3-methyl-3-penten-1-yne, and 3,5-dimethyl-3-hexen-1-yne; alkenyl group-containing low molecular weight siloxanes such as tetramethyltetravinylcyclotetrasiloxane and tetramethyltetrahexenylcyclotetrasiloxane; and alkynyloxysilanes such as methyl tris(1,1-dimethyl propynyloxy)silane and vinyl tris(1,1-dimethyl propynyloxy)silane. The content of the curing retardant is not limited, but is preferably within the range of 10 to 10000 ppm in terms of mass units, with regard to the composition.

As the adhesion imparting agent, an organic silicon compound having at least one alkoxy group bonded to a silicon atom in one molecule is preferable. Examples of this alkoxy group include a methoxy group, an ethoxy group, a propoxy group, a butoxy group, and a methoxyethoxy group, with a methoxy group particularly preferable. Moreover, examples of groups other than alkoxy group, bonded to the silicon atom of the organic silicon compound include: halogen substituted or unsubstituted monovalent hydrocarbon groups such as an alkyl group, an alkenyl group, an aryl group, an aralkyl group, and a halogenated alkyl group; glycidoxyalkyl groups such as a 3-glycidoxypropyl group and a 4-glycidoxybutyl group; epoxycyclohexylalkyl groups such as a 2-(3,4-epoxycyclohexyl)ethyl group and a 3-(3,4-epoxycyclohexyl)propyl group; epoxyalkyl groups such as a 3,4-epoxybutyl group and 7,8-epoxyoctyl groups; acryl group-containing monovalent organic groups such as 3-methacryloxypropyl groups; and hydrogen atoms. This organosilicon compound preferably has a group that may react with an alkenyl group or a silicon-bonded hydrogen atom in this composition, and specifically, preferably has a silicon-bonded hydrogen atom or an alkenyl group. Moreover, because favorable adhesion can be imparted to various substrates, this organosilicon compound preferably has at least one epoxy group-containing monovalent organic group per one molecule. Examples of such an organic silicon compound include an organosilane compound, an organosiloxane oligomer, and an alkyl silicate. Examples of molecular structures of this organosiloxane oligomer or alkyl silicate include a linear structure, a partially branched linear structure, a branched structure, a cyclic structure, and a network structure, among which a linear structure, a branched structure, and a network structure are particularly preferable. Examples of the organic silicon compound include silane compounds such as 3-glycidoxypropyltrimethoxysilane, 2-(3,4-epoxycyclohexyl) ethyltrimethoxysilane, and 3-methacryloxypropyltrimethoxysilane;

siloxane compounds with at least one of each of a silicon-bonded alkenyl group or a silicon-bonded hydrogen atom and a silicon-bonded alkoxy group in one molecule; a silane compound or siloxane compound having at least one silicon-bonded alkoxy group; a mixture of siloxane compounds having at least one each of silicon-bonded alkenyl group and silicon-bonded alkenyl group in one molecule, a reaction mixture of an amino group-containing organoalkoxysilane and an epoxy group-containing organoalkoxysilane, and an organic compound having at least two alkoxysilyl groups containing bonds other than silicon-oxygen bonds between their silyl groups in one molecule; general formula:

$R^a{}_n Si(OR^b)_{4-n}$ (wherein, $R^a$ represents an organic group containing a monovalent epoxy group, $R^b$ represents an alkyl group having 1 to 6 carbon atoms, or a hydrogen atom and n represents a number within a range of 1 to 3), representing epoxy group-containing silane or a partially hydrolyzed condensate, reaction mixture of vinyl group-containing siloxane oligomer (including chain or ring shaped structure) and epoxy group-containing trialkoxysilane, methyl polysilicate, ethyl polysilicate, and epoxy group-containing ethyl polysilicate.

The adhesion imparting agent is preferably in the form of a low viscosity liquid, and the viscosity thereof is not limited, but is preferably within the range of 1 to 500 mPa·s at 25° C. In addition, while not limited thereto, the content of this adhesion imparting agent is preferably within the range of 0.01 to 10 mass parts with regard to 100 mass parts of the total of the present composition.

In the present invention, a reaction mixture of an organoalkoxysilane containing an amino group and an organoalkoxysilane containing an epoxy group are examples of a particularly suitable adhesive imparting agent. This component is a component for improving initial adhesiveness to various substrates in contact with during curing, in addition to improving adhesiveness at low temperatures particularly to an unwashed adherend. Moreover, some curing systems of a curable silicone composition obtained by blending this adhesion promoter may act as a crosslinking agent. Such a reaction mixture is disclosed in JP S52-8854 and JP H10-195085.

Examples of alkoxysilanes having an amino group-containing organic group forming such component include an aminomethyltriethoxysilane, 3-aminopropyltrimethoxysilane, 3-aminopropyltriethoxysilane, 3-aminopropylmethyldimethoxysilane, N-(2-aminoethyl)aminomethyltributoxysilane, N-(2-aminoethyl)-3-aminopropyltrimethoxysilane, N-(2-aminoethyl)-3-aminopropylmethyldimethoxysilane, and 3-anilinopropyltriethoxysilane.

Moreover, examples of epoxy group-containing organoalkoxysilanes may include 3-glycidoxyprolyltrimethoxysilane, 3-glycidoxypropylmethyldimethoxysilane, 2-(3,4-epoxycyclohexyl)ethyltrimethoxysilane, and 2-(3,4-epoxycyclohexyl)ethylmethyldimethoxysilane.

The ratio of the alkoxysilane having an amino group containing organic group to the alkoxysilane having an epoxy group-containing organic group is, in terms of molar ratio, preferably within the range of (1:1.5) to (1:5), and particularly preferably within the range of (1:2) to (1:4). This component (e1) can be easily synthesized by mixing alkoxysilane having an amino group containing organic group and alkoxysilane having an epoxy group containing organic group as mentioned above to cause them to react at room temperature or by heating.

In particular, when an alkoxysilane having an amino group containing organic group is reacted with an alkoxysilane having an epoxy group containing organic group by the method described in Japanese Unexamined Patent Application H10-195085A, the present invention particularly preferably contains a carbasilatrane derivative obtained by cyclizing by an alcohol exchange reaction and expressed by the general formula:

[Formula 1]

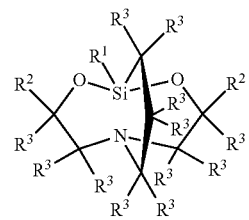

{where $R^1$ is an alkyl group, alkenyl group, or an alkoxy group, and $R^2$ is the same or different group selected from the group consisting of groups expressed by the general formula:

[Formula 2]

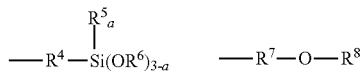

(where $R^4$ is an alkylene group or alkyleneoxyalkylene group, $R^5$ is a monovalent hydrocarbon group, $R^6$ is an alkyl group, $R^7$ is an alkylene group, $R^8$ is an alkyl group, alkenyl group, or acyl group, and a is 0, 1, or 2), and
$R^3$ is the same or different hydrogen atom or alkyl group}.

Examples of carbasilatrane derivatives may include carbasilatrane derivatives having a silicon-bonded alkoxy group or a silicon atom-bonded alkenyl group per one molecule represented by the following structure.

[Formula 3]

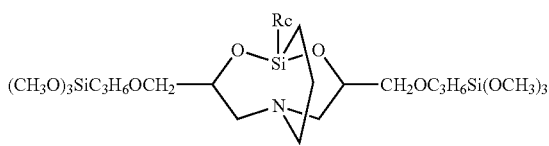

(where Rc is a group selected from methoxy groups, ethoxy groups, vinyl groups, allyl groups and hexenyl groups)

Furthermore, in the present invention, a silatrane derivative as represented by the following structural formula may be utilized as an adhesion-imparting agent.

[Formula 4]

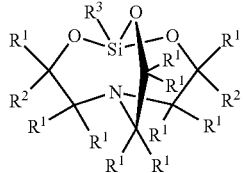

$R^1$ in the formula is the same or a different hydrogen atom or alkyl group, and $R^1$ is particularly preferably a hydrogen atom or a methyl group. Furthermore, $R^2$ in the aforementioned formula is the same or different group selected from a group consisting of a hydrogen atom, alkyl groups, and organic group containing an alkoxysilyl group as expressed by the general formula:

$$-R^4-Si(OR^5)_xR^6_{(3-x)}$$

where at least one of the $R^2$ is the organic group containing an alkoxysilyl group. Examples of the alkyl group of $R^2$ include methyl groups and the like. Furthermore, in the organic group containing an alkoxysilyl group of $R^2$, $R^4$ in the formula is a divalent organic group, and examples include alkylene groups or alkyleneoxyalkylene groups. An ethylene group, a propylene group, a butylene group, a methyleneoxypropylene group, and a methyleneoxypentylene group are particularly preferable. Furthermore, $R^5$ in the formula is an alkyl group having 1 to 10 carbon atoms, and is preferably a methyl group or an ethyl group. Furthermore, $R^6$ in the formula is a substituted or unsubstituted monovalent hydrocarbon group, and preferably a methyl group. Furthermore, x in the formula is 1, 2, or 3, and preferably 3.

Examples of such an organic group containing an alkoxysilyl group of $R^2$ include the following groups.
—(CH2)2Si(OCH3)3—(CH2)2Si(OCH3)2CH3
—(CH2)3Si(OC2H5)3—(CH2)3Si(OC2H5)(CH3)2
—CH2O(CH2)3Si(OCH3)3
—CH2O(CH2)3Si(OC2H5)3
—CH2O(CH2)3Si(OCH3)2CH3
—CH2O(CH2)3Si(OC2H5)2CH3
—CH2OCH2Si(OCH3)3—CH2OCH2Si(OCH3)(CH3)2

$R^3$ in the above formula is at least one group selected from a group consisting of substituted or unsubstituted monovalent hydrocarbon groups, alkoxy groups having 1 to 10 carbon atoms, glycidoxyalkyl groups, oxiranylalkyl groups, and acyloxyalkyl groups. Examples of the monovalent hydrocarbon group of $R^3$ include methyl groups and other alkyl groups. Examples of the alkoxy group of $R^3$ include methoxy groups, ethoxy groups, and propoxy groups. Examples of the glycidoxyalkyl group of $R^3$ include 3-glycidoxypropyl groups. Examples of the oxiranylalkyl group of $R^3$ include 4-oxiranylbutyl groups and 8-oxiranyl octyl groups. Examples of the acyloxyalkyl group of $R^3$ include acetoxypropyl groups and 3-methacryloxypropyl groups. In particular, $R^3$ is preferably an alkyl group, an alkenyl group, or an alkoxy group, and more preferably an alkyl group or an alkenyl group. Particularly preferred examples include groups selected from methyl groups, vinyl groups, allyl groups, and hexenyl groups.

Furthermore, the composition may contain, as other optional components, heat resistance agents such as iron oxide (red iron oxide), cerium oxide, cerium dimethyl silanolate, fatty acid cerium salt, cerium hydroxide, zirconium compound, and the like; and dyes, pigments other than white, flame retardant agents, and the like, may be contained as long as the purpose of the present invention is not impaired.

The composition may be used in the form of granules, pellets, or sheets. The pellet shape is obtained by compression molding of the present composition, and is superior in terms of workability and curability. The "pellet" may also be referred to as a "tablet". The shape of the pellet is not restricted, but is usually spherical, elliptical spherical, or cylindrical. The size of the pellet is not restricted, and for example, the pellet has an average particle diameter or a circle equivalent diameter of 500 μm or more. When producing this manner of pellet shaped composition, tableting the granulated composition is a favorable production method. If making the composition of the present invention in granular form, the components (A) to (D) can be produced through stirring using the powder kneading machine described below.

The composition may be molded into a sheet for use. For example, a sheet made of a curable silicone composition having an average thickness of 10 to 1,000 μm is advantageous in that the composition has hot-melt properties and heating-curability at high temperatures, and so in particular, demonstrates excellent workability and melting properties when used in compression molding or the like.

This manner of sheet shaped composition may be produced by unifying all the components in a uniaxial or biaxial continuous kneading machine and then passing them through two rolls or the like to achieve a prescribed thickness. The thickness may also be adjusted by obtaining the aforementioned granular curable silicone compositions and then homogenizing them with a mixer.

[Use as Laminates and Film Adhesives]

The composition can be used in sheet form, in particular as a laminate body, having a structure including a sheet-like member made up of the curable silicone composition described above between two film-like substrates equipped with a release layer.

There are no particular restrictions on the method of manufacturing such a peelable laminate, but a manufacturing method for a curable silicone sheet is achieved by the following steps:

Step 1: step of mixing the structural components of the curable silicone composition described above.

Step 2: step of kneading the mixture obtained in step 1 while heating and melting Step 3: step of laminating the heated and melted mixture obtained in step 2 between films provided with at least one release surface Step 4: step of stretching the laminate body obtained in step 3 between rollers to mold a curable silicone sheet having a specific film thickness.

Optionally, in step 4, rollers that are cooled or have a temperature control function may be used. Also, a step of cutting the laminate comprising the obtained curable silicone sheet can be provided after step 4.

The type of the film substrate is not particularly restricted, and polyester film, polyolefin film, polycarbonate film, acrylic film, and the like can be used as appropriate. The sheet-like substrate is preferably non-porous.

The release layer is necessary for easily peeling off the sheet-like material consisting of the curable silicone composition from the film-like substrate, and is sometimes called a release liner, separator, release layer, or release coating layer. Suitably, the release layer can be a silicone release agent, a fluorine release agent, an alkyd release agent, a release agent with a release coating function such as a fluorosilicone release agent and the like, or a substrate in and of itself that is difficult for the adhesive material layer to adhere to, made up of the curing reactive silicone adhesive composition of the present invention or the cured product thereof. In particular, in the laminated body of the present invention, a release layer obtained by curing a fluorosilicone based release agent is preferably used as the release layer.

The laminate described above can be used, for example, by peeling off the sheet-like member in an uncured state from the film-like substrate after applying the sheet-like member made up of the curable silicone composition to the adherend.

The composition of the present invention is a non-fluid solid at 25° C. and is to be handled in granular, pellet, or sheet form at room temperature. Here, the term "non-fluid" means that deforming or flowing does not occur in a no-load condition, and preferably does not deform or flow in a no-load condition at 25° C. when molded into a pellet, a tablet, or the like. Such non-fluidity can be evaluated, for example, by placing a molded product of the composition on a hot plate at 25° C. and making sure substantial deforming or flowing under no load or constant weight does not occur. This is because, when non-fluid at 25° C., shape retention at this temperature is good and the surface tackiness is low.

The softening point of the composition is preferably 100° C. or less. Such softening point means a temperature at which the deformation amount in the height direction is 1 mm or more when the deformation amount of the composition is measured after a load is removed after continuing to press the hot plate from above with a load of 100 grams for 10 seconds.

The present composition tends to decrease in viscosity rapidly under high temperature and high pressure (that is, in the molding step), and a value measured at a similar high temperature and high pressure is preferably used as a useful melt viscosity value. Therefore, the melt viscosity of the present invention is more preferably measured under high pressure using a Koka-type flow tester (manufactured by the Shimadzu Corporation) than measured with a rotational viscometer such as a rheometer. Specifically, the present composition should have a melt viscosity at 150° C. of 200 Pa·s or less, and more preferably 150 Pa·s or less. This is because after hot-melting and cooling to 25° C., the composition has good adhesion to the substrate.

[Manufacturing Method of the Curable Silicone Composition]

The composition can be produced by powder mixing components (A) to (D), as well as any other component (E)), at a temperature of less than 50° C. The powder mixer used in this manufacturing method is not restricted, and examples include a uniaxial or biaxial continuous mixer, a two-roll mixer, a ROSS mixer, a Hobart mixer, a dental mixer, a planetary mixer, a kneader mixer, a laboratory mill, a small-sized grinder, and a henschel mixer, and preferably, a laboratory mill or a henschel mixer.

[Manufacturing Method of the Curable Silicone Sheet]

The curable silicone sheet of the present invention has hot-melt properties and is made up of a curable silicone composition containing organopolysiloxane resin, a curing agent, and functional fillers and the manufacturing method of the present invention includes the following steps 1 to 4.
Step 1: a step of mixing the structural components of the curable silicone composition at a temperature of 50° C. or higher
Step 2: step of kneading the mixture obtained in step 1 while heating and melting
Step 3: step of laminating the heated and melted mixture obtained in step 2 between films provided with at least one release surface
Step 4: step of stretching the laminate body obtained in step 3 between rollers to mold a curable silicone sheet having a specific film thickness
Herein, "having hot-melt properties" means having a softening point within a range of 50° C. to 200° C. and having properties where softening or flowing occurs when heated. Regardless of the hot-melt properties of the organopolysiloxane resin, which is a structural component of the curable silicone sheet, it is sufficient if the mixture that makes up the organopolysiloxane resin, the curing agent and the functional filler has hot-melt properties.

[Step 1]

Step 1 described above is a mixing process of a curable granular silicone composition including an organopolysiloxane resin (preferably in the form of microparticles), a curing agent, and a functional filler, which are structural components of the curable silicone composition. Each of these components is as described above.

The mixture obtained in step 1 is a curable granular silicone composition, and the mixture as a whole has hot-melt properties. On the other hand, the mixture is non-fluid at 25° C. Here, the term "non-fluid" means that deforming or flowing does not occur in a no-load condition, and preferably does not deform or flow in a no-load condition at 25° C. when molded into a pellet, a tablet, or the like. This state of non-fluidity can be evaluated, for example, by placing a molded product of the composition on a hot plate at 25° C. and making sure substantial deforming or flowing under no load or constant weight does not occur. This is because, when non-fluid at 25° C., shape retention at this temperature is good and the surface tackiness is low.

The softening point of the mixture obtained by step 1 is 200° C. or lower, and preferably 150° C. or lower. Softening point means a temperature at which the deformation amount in the height direction is 1 mm or more when the deformation amount of the composition is measured after a load is removed after continuing to press the hot plate from above with a load of 100 grams for 10 seconds.

The softening point of the mixture obtained by step 1 is 200° C. or less. By heating the entire mixture to a temperature higher than the softening point of the mixture in step 2 described later, the mixture can be heated and melted to provide a certain fluidity. The softened or melted material can be molded to obtain a curable silicone sheet containing a curable granular silicone composition and having hot-melt properties.

The process of mixing the organopolysiloxane resin, the curing agent, and the functional filler, as well as any other components, is not particularly restricted, and can be produced by powder mixing the entire mixture, suitably at a temperature below the softening point of the organopolysiloxane resin microparticles. The powder mixer used in the present manufacturing method is not restricted, and examples include a uniaxial or biaxial continuous mixer, a two-roll mixer, a ROSS mixer, a Hobart mixer, a dental mixer, a planetary mixer, a kneader mixer, a laboratory mill, a small grinder, and a henschel mixer, and preferably, a laboratory mill, a small grinder, or a henschel mixer.

[Step 2]

Step 2 is a step in which the mixture obtained in step 1 is kneaded while being heated and melted. By heating and kneading the mixture having heat-melting properties at a temperature above the softening point, preferably within a temperature range of 50° C. to 200° C., the entire composition is melted or softened, and the organopolysiloxane resin microparticles, curing agent, and functional filler can be uniformly and entirely dispersed. When the mixture is pressurized and molded into a sheet in step 4 after passing through step 3, a uniform thin layered molded sheet can be formed by a single pressurization. Moreover, there is a practical benefit in avoiding molding defects and cracks in the sheet itself. On the other hand, if the temperature is less than the lower limit, softening may be insufficient and a molten or softened mixture in which each component is uniformly and entirely dispersed may be difficult to obtain, even by using mechanical force. Even if the mixture is pressure-molded into a sheet in step 4 after passing through step 3, a uniform thin layered molded sheet may not be formed, which may cause breaking or cracking of the sheet. Conversely, if the temperature exceeds the upper limit, the curing agent reacts during mixing and the entire product may significantly thicken or harden, losing the hot-melt properties thereby and forming a cured product, which is not desirable. For this reason, when a hydrosilylation catalyst is used for component (C), use of a platinum-containing hydrosilylation reaction catalyst in the form of microparticles dispersed or encapsulated in a thermoplastic resin is preferable.

If the heat-melt viscosity of the mixture obtained in step 1 is low and the mixture has high fluidity, lamination is possible on the release film after temporary molding in advance in step 3 described later, which is preferable. Specifically, so long as the melt viscosity of the heated and melted mixture obtained in step 2 is within a range of 1 to 1,000 Pas as measured by a Koka flow tester at 150° C., temporary molding can be performed in step 3.

On the other hand, if the mixture obtained in step 1 has a high heat-melt viscosity and low fluidity, the mixture obtained in step 1 may be melt-kneaded at a temperature above the softening point thereof in step 2 to obtain a uniform compositional form, and then laminated onto the release film in step 3 without temporary molding.

The mixing device in step 2 is not restricted, and can be: a kneader, a Banbury mixer, a Henschel mixer, a planetary mixer, a two-roller mill, a three-roller mill, a Ross mixer, a Labo Plastomill, or the like, or other batch type mixer, provided with heating and cooling functions; and a single-screw extruder, a twin-screw extruder, or other continuous type heating and kneading equipment, provided with heating and cooling functions. The mixer is not particularly limited, but is selected in accordance with the efficiency of the processing time and the ability to control the shear heat generation. In view of processing time, the mixer may be a continuous heating and kneading device, such as a single screw extruder, a twin screw extruder, or the like, or a batch type mixer such as a Labo Plastomill or the like. However, from the perspective of production efficiency of the curable silicone sheet, a continuous heating and kneading device such as a single-screw extruder, a twin-screw extruder, and the like is preferably used.

[Step 3]

Step 3 is a step of laminating the heated and melted mixture obtained in step 2 between films provided with at least one release surface, and is a preliminary step for pressure molding in step 4. By forming a laminate body in which the mixture obtained in step 2 is sandwiched between films, a sheet-like molded product can be obtained by pressure molding through roller stretching from the film, and after molding, removal of only the film from the sheet-like molded product using the release surface is feasible.

The heated and melted mixture obtained in step 2 is laminated between two films. Depending on the form of use of the obtained curable silicone sheet, the two films preferably both have a release surface, and in step 3, the mixture obtained in step 2 is particularly preferably laminated between the release surfaces of the films. By adopting this manner of laminated form, a laminate sheet where the thin layer curable silicone sheet is interposed between peelable films and which can be released from both sides can be obtained through the pressure molding in step 4 and then optional cutting. At the time of use, exposing only the curable silicone sheet by peeling off the film on both surfaces is feasible without concern for damaging the formed curable silicone sheet.

The substrate of the film used in step 3 is not particularly restricted, and examples include paperboard, cardboard paper, clay-coated papers, polyolefin laminate papers, particularly polyethylene laminate papers, synthetic resin films and sheets, natural fiber woven materials, synthetic fiber woven materials, artificial leather woven materials, and metal foils. Synthetic resin films and sheets are particularly preferable, and examples of synthetic resins include polyimide, polyethylene, polypropylene, polystyrene, polyvinyl chloride, polyvinylidene chloride, polycarbonate, polyethylene terephthalate, and nylon. When heat resistance is required, a heat-resistant synthetic resin film such as a polyimide, polyetheretherketone, polyethylene naphthalate (PEN), liquid crystal polyacrylate, polyamide-imide, polyether sulfone, and the like is particularly preferable. Meanwhile, for applications such as a display device in which visibility is required, a transparent substrate and specifically a transparent material such as a polypropylene, polystyrene, polyvinylidene chloride, polycarbonate, polyethylene terephthalate, PEN, and the like is preferable.

The thickness of the film is not particularly restricted, but is usually from 5 to 300 μm.

The film is preferably provided with at least one release layer, and the release layer is preferably in contact with the mixture obtained in step 2. This allows the pressure-molded hot-melt curable silicone sheet to be easily released from the film through step 3 and step 4. The release layer may also be referred to as a release liner, a separator, a release layer, or a release coating layer, and may preferably be a release layer having a release coating ability such as a silicone-based release agent, a fluorine-based release agent, an alkyd-based release agent, a fluorosilicone-based release agent, or the like, or may be formed as a substrate itself which is not prone to adhering to the hot-melt curable silicone sheet according to the present invention by forming physically fine irregularities in the surface of the substrate.

In step 3, the mixture obtained in step 2 is laminated between two films. The process is not particularly restricted, but the mixture obtained in step 2 is supplied through being discharged or applied onto the release layer of a first film, and a laminate is formed by laminating the release layer of a second film on top of said mixture. Here, in the step of continuous manufacturing of a curable silicone sheet, each film is transported via a rotating roller to a supply position of the mixture in step 2, and a lamination operation between films is performed.

The supply rate of the mixture obtained in step 2 between the films in step 3 can be designed based on the manufacturing speed and scale thereof. As an example, the mixture obtained in step 2 can be supplied between the films at a supply rate of 1 to 10 kg/hour, but needless to say, is not limited thereto. However, in step 3, the amount of the mixture obtained in step 2 that is laminated between the films must be determined based on the average thickness of the curable silicone sheet designed in step 4, and must be a thickness that allows rolling processing in step 4.

If the mixture obtained in step 1 has a low melt viscosity while heated and is highly fluid, in step 3, the mixture after heat-melting obtained in step 2 is preferably discharged while being molded into a film using a die and laminated between films. Herein, the die is used to temporarily mold the mixture, and although the type of the die and the thickness at the time of the temporary molding are not particularly restricted, the mixture can be and is preferably temporarily molded into an essentially sheet shape having a thickness within a range of 100 to 2,000 μm (=2 mm) using a T-die.

If the mixture obtained in step 1 has a low melt viscosity while heated and is highly fluid, a step of cooling or adjusting the temperature of the entire laminate body obtained in step 3 is preferably included as a step prior to step 4 or in step 4, after the temporary molding described above. This is because the heated molten product is cooled to a solid state to effectively perform pressure molding in step 4. The cooling step is not particularly restricted, but can be performed by cooling the mixture supplied or laminated on the film by a cooling roller or the like within a range of −50° C. to room temperature using cooling means such as air cooling, a cooling solvent, or the like. Note that details of temperature control will be described in step 4.

On the other hand, if the mixture obtained in step 1 has a high heat-melt viscosity and inferior fluidity, a semi-solid mixture may be supplied and laminated on the film in step 3 without performing temporary molding.

[Step 4]

Step 4 is a step in which the laminate body obtained in step 3 described above is stretched between rollers to form a curable silicone sheet having a specific film thickness, and in which the mixture obtained in step 2 is applied and stretched while on the film to mold a uniform curable silicone sheet.

The roll processing step in step 4 can be performed on the laminate body obtained in step 3 using a known rolling method such as roller rolling or the like. In particular, roller rolling has an advantage where the curable silicone sheet can be designed with a desired thickness by adjusting a gap between the rollers. For example, a curable silicone sheet having excellent flatness and very few defects on the sheet surface and inside the sheet can be obtained by adjusting the gap between the rollers to a constant level where the average thickness is within a range of 10 to 2,000 μm, and then rolling. More specifically, for roller rolling, the gap between the rollers is particularly preferably adjusted to be within a range of 1.5 to 4.0 times the average thickness of the target organopolysiloxane cured product film.

By stretching in accordance with step 4, an essentially flat, 10 to 2000 μm thick curable silicone sheet can be obtained. By roller stretching the heated and melted mixture of step 2 in the form of a laminate body between the release films in accordance with step 3, a peelable laminate containing a curable silicone sheet having hot-melt properties, which has low defects and excellent workability by releasing, can be obtained.

[Temperature Adjustment in Step 4]

In step 4, when the laminate body obtained in step 3 is stretched between rollers, the rollers are preferably further provided with a temperature controlling function to control the temperature of the entire laminate body during roller rolling to perform heating or cooling as necessary. Adjusting the temperature has benefits where a gap between the rollers can be stably maintained, and the flatness and uniformity (uniformity of film thickness) of the obtained curable silicone sheet having hot-melt properties can be improved. A specific range of temperature adjustment can be designed as appropriate based on the heat resistance of the film, the thickness of the curable silicone sheet (design thickness), reactivity thereof, and the like, but is generally within a range of 5 to 150° C.

[Cutting Step]

Step 4 enables obtaining a peelable laminate in which the curable silicone sheet is interposed between the peelable films, and may optionally include a step of cutting the laminate body containing the curable silicone sheet. The curable silicone sheet may also have a wind up process using a winding device. Thereby, a peelable laminate containing a hot-melt curable silicone sheet of a desired size can be obtained.

[Laminate Body]

The laminate body obtained according to the steps described above is a laminate body containing an essentially flat, hot-melt curable silicone sheet with a thickness of 10 to 2000 μm, which contains organopolysiloxane resin microparticles, a curing agent, and functional filler, and is provided with a laminated layer structure between films with at least one release surface. Note that both of the films may be and are preferably provided with a release surface.

[Curable Silicone Sheet]

The curable silicone sheet obtained by the manufacturing method of the present invention is a curable silicone composition made up of an organopolysiloxane resin, a curing agent, and functional filler, which has hot-melt properties and can be used as a heat-melting adhesive material. In particular, the curable silicone sheet has excellent formability, gap fill properties, and peeling force, and can be used as a die attach film and film adhesive. The sheet can also be suitably used as a compression molding or press molding curable silicone sheet.

Specifically, the curable silicone sheet obtained by the manufacturing method of the present invention, after being peeled from the release film, is arranged on a desired site of a semiconductor or the like, and a film adhesive layer is formed on an adherend utilizing the gap fill properties with regard to unevenness and gaps, and is temporarily secured, arranged, and attached between adherends. Moreover, the curable silicone sheet may be heated to 150° C. or higher to adhere the adherends together by the cured product of the curable silicone sheet. The peelable film may be peeled off after the curable silicone sheet is heated to form a cured product, and the timing of the peeling may be selected according to the application and use of the curable silicone sheet.

The curable silicone sheet is hot-meltable, and therefore, flexibility or fluidity are provided by heating the sheet before final curing. For example, even if the adhering surface of the adherend is uneven, unevenness and gaps can be filled without voids to form an adhesive surface. Examples of heating means of the curable silicone sheet that can be used include various thermostatic baths, hot plates, electromagnetic heating devices, heating rollers, and the like. In order to perform more efficient adhering and heating, for example, an electric heat pressing machine, a diaphragm type laminator, a roller laminator, or the like is preferably used.

[Method of Molding Cured Product]

The composition can be cured by a method comprising at least the following steps (I) to (III).

(I) a step of heating to a temperature of 100° C. or higher to melt the present composition;

(II) a step of injecting the curable silicone composition obtained in step (I) into a mold or a step of distributing the curable silicone composition obtained in step (I) to a mold by clamping; and (III) a step of curing the curable silicone composition injected in step (II).

In the above steps, a transfer molding machine, a compression molding machine, an injection molding machine, an auxiliary ram molding machine, a slide molding machine, a double ram molding machine, a low pressure sealing molding machine, or the like can be used. In particular, the composition of the present invention can be suitably used for the purpose of obtaining a cured product by transfer molding and compression molding.

Finally, in step (III), the curable silicone composition injected (applied) in step (II) is cured. In the case where (c1) organic peroxide is used as component (C), the heating temperature is preferably 150° C. or higher or 170° C. or higher, and in the case where (c2), organohydrogenpolysiloxane having at least two silicon-bonded hydrogen atoms in a molecule and a hydrosilylation reaction catalyst is used, the heating temperature is preferably 100° C. or higher or 130° C. or higher.

On the other hand, the curable silicone composition of the present invention can be molded into a thin film-like sheet having a thickness in the range of 100 to 1,000 µm by sandwiching the composition between sheet-like substrates provided with a release layer as described above and molding to a prescribed thickness through two rolls or the like. The thin film-like sheet made up of the curable silicone composition can be used as a die attach film or a film-like curable silicone adhesive for manufacturing semiconductor chips and the like.

[Use of Composition]

Since the composition has hot-melt properties, excellent workability and curability while melted (hot-melt), and excellent coloration resistance of the resulting cured product under high temperature, the composition is usefully used for semiconductor members such as optical reflective materials for light emitting/optical devices and optical semiconductors having the cured product. Furthermore, since the cured product has superior mechanical properties, the cured product is suitable as an encapsulant for semiconductors; an encapsulant for power semiconductors such as SiC, GaN, or the like; an adhesive, potting agent, protective agent, and coating agent for electrical and electronic applications. Since the composition has hot-melt properties, the composition is also suitable as a material for transfer molding, compression molding, or injection molding. In particular, the composition is preferably used as an encapsulant for semiconductors using an overmold molding method at the time of molding. Furthermore, a sheet of this composition can be used as a curable film adhesive or as a stress buffer layer between two substrates with different coefficients of linear expansion.

In addition, the curable silicone composition of the present invention, especially the curable silicone composition which are in pellet or sheet form, can be used for large-area encapsulation of semiconductor substrates (including wafers). Furthermore, a sheet formed from the curable silicone composition of the present invention can be used for die attach films, sealing a flexible device, stress relief layers for bonding two different substrates, and the like.

[Cured Product Applications]

The application of the cured product of the present invention is not particularly limited, but the composition of the present invention has hot-melt properties, is excellent in moldability and mechanical properties, and the cured product exhibits characteristic behavior of an average linear expansion coefficient and a storage modulus at room temperature to high temperature as described above. Therefore, the cured product obtained by curing the present composition can be suitably used as a member for a semiconductor device, and can be suitably used as an encapsulant for a semiconductor element, an IC chip or the like, and as an adhesive/bonding member of a conductor device.

A semiconductor device equipped with a member made of the cured product of the present invention is not particularly limited, but is particularly preferable to be a light emitting semiconductor device which is a light emitting/optical device. Since the cured product of the present invention has superior coloration resistance at high temperatures, the cured product is more suitable for use as a light reflecting material used in optical semiconductor devices where whiteness is important.

EXAMPLES

The hot-melt curable silicone composition of the present invention and manufacturing method thereof are described in detail by means of examples and comparative examples. Note that in the formulas, Me and Vi represent a methyl group and a vinyl group, respectively. The softening points of the curable silicone compositions of each example and comparative example were measured by the following methods. The curable silicone composition was heated at 150° C. for 2 hours to produce a cured product, and the elastic modulus and tensile elongation were measured using the following methods. The results are shown in Table 1.

[Melt Viscosity]

The melt viscosity of the curable silicone composition at 150° C. was measured using a Koka type flow tester CFT-500EX (manufactured by Shimadzu Corporation) using a nozzle of 0.5 mm diameter under 100 kgf weight.

[Storage Elastic Modulus]

The curable silicone composition was heated at 150° C. for 2 hours to prepare a cured product. The storage modulus of the cured product from −50° C. to 250° C. was measured using a rheometer ARES (manufactured by TA Instruments Japan Inc.) and the values at 25° C. were read. Table 1 shows the values measured at 25° C.

[Tensile Elongation]

The curable silicone composition was heated at 150° C. for 2 hours to prepare a cured product. The tensile elongation rate of the cured product was measured using the method specified in JIS K 6251-2010 "Vulcanized Rubber and Thermoplastic Rubber—Determination of Tensile Properties."

[Thermal Conductivity]

The curable silicone composition was heated at 150° C. for 2 hours to produce a cured product with a size of 1.5 cm×1.5 cm×1.0 cm (thickness). The thermal conductivity of the cured product was measured using the hot disk method using a TPS500S (manufactured by Hot Disk). The results are shown in Table 1.

Organopolysiloxane resins containing a hydrosilylation reaction catalyst were prepared using the methods shown in Reference Examples 1 to 7 below, and the hot-melt properties thereof were evaluated based on the presence or absence of softening point/melt viscosity. The organopolysiloxane resin microparticles were also prepared by the method shown in Reference Examples 8 to 13. In the reference examples, the 1,1,3,3-tetramethyl-1,3-divinyl disiloxane used for the platinum complex that is the hydrosilylation reaction catalyst is described as "1,3-divinyltetramethyldisiloxane".

(Measurement of the Molecular Weight of Organopolysiloxane Resin)

The weight average molecular weight (Mw) of the organopolysiloxane resin in each reference example was determined using gel permeation chromatography (GPC) introduced by Waters Corporation, using toluene as the solvent and based on standard polystyrene equivalent.

Reference Example 1

A xylene solution of a resinous organopolysiloxane (1) containing 10 ppm of platinum metal in mass units was prepared by introducing 270.5 g of a 55% by mass xylene solution of a resinous organopolysiloxane represented by the average unit formula: $(Me_3SiO_{1/2})_{0.44}(SiO_{4/2})_{0.56}(HO_{1/2})_{0.02}$ which is a white solid at 25° C., and 0.375 g of a 1,3-divinyltetramethyldisiloxane solution of platinum 1,3-divinyltetramethyldisiloxane complex (platinum metal content=approximately 4,000 ppm) into a 1 L flask and stirring until uniform at room temperature (25° C.).

In addition, the organopolysiloxane resin (1) did not soften/melt even when heated to 200° C. and did not have hot-melt properties. The weight average molecular weight obtained through GPC measurement with toluene solvent was 18,500 Da.

Reference Example 2

A xylene solution of a resinous organopolysiloxane (2) containing 10 ppm of platinum metal in mass units was prepared by introducing 270.5 g of a 55 mass % xylene solution of a resinous organopolysiloxane represented by the average unit formula: $(Me_3SiO_{1/2})_{0.46}(SiO_{4/2})_{0.54}(HO_{1/2})_{0.02}$ which is a white solid at 25° C., and 0.375 g of a 1,3-divinyltetramethyldisiloxane solution of platinum 1,3-divinyltetramethyldisiloxane complex (platinum metal content=approximately 4,000 ppm) into a 1 L flask and stirring until uniform at room temperature (25° C.).
In addition, the organopolysiloxane resin (2) did not soften/melt even when heated to 200° C. and did not have hot-melt properties. The weight average molecular weight obtained through GPC measurement with toluene solvent was 11,000 Da.

Reference Example 3

A xylene solution of a resinous organopolysiloxane (3) containing 10 ppm of platinum metal in mass units was prepared by introducing 270.5 g of a 55 mass % xylene solution of a resinous organopolysiloxane represented by the average unit formula: $(Me_3SiO_{1/2})_{0.475}(SiO_{4/2})_{0.525}(HO_{1/2})_{0.02}$ which is a white solid at 25° C., and 0.375 g of a 1,3-divinyltetramethyldisiloxane solution of platinum 1,3-divinyltetramethyldisiloxane complex (platinum metal content=approximately 4,000 ppm) into a 1 L flask and stirring until uniform at room temperature (25° C.).
In addition, the organopolysiloxane resin (3) did not soften/melt even when heated to 200° C. and did not have hot-melt properties. The weight average molecular weight obtained through GPC measurement with toluene solvent was 7,000 Da.

Reference Example 4

A xylene solution of a resinous organopolysiloxane (1) containing 10 ppm of platinum metal in mass units was prepared by introducing 270.5 g of a 55 mass % xylene solution of a resinous organopolysiloxane represented by the average unit formula: $(Me_3SiO_{1/2})_{0.49}(SiO_{4/2})_{0.51}(HO_{1/2})_{0.02}$ which is a white solid at 25° C., and 0.0375 g of a 1,3-divinyltetramethyldisiloxane solution of platinum 1,3-divinyltetramethyldisiloxane complex (platinum metal content=approximately 4,000 ppm) into a 1 L flask and stirring until uniform at room temperature (25° C.).
In addition, the organopolysiloxane resin (4) did not soften/melt even when heated to 200° C. and did not have hot-melt properties. The weight average molecular weight obtained through GPC measurement with toluene solvent was 4,000 Da.

Reference Example 5

A xylene solution with 55 mass % of organopolysiloxane with an average unit formula: $(Me_3SiO_{1/2})_{0.65}(SiO_{4/2})_{0.35}(HO_{1/2})_{0.02}$ was dried under reduced pressure to remove the xylene, and an organopolysiloxane resin that is liquid at room temperature was obtained. The weight average molecular weight obtained through GPC measurement with toluene solvent was 1,100 Da. 70.0 g of this organopolysiloxane resin and 30.0 g of dimethylpolysiloxane capped at both molecular terminals with dimethylvinylsiloxy groups (vinyl group content=0.09 mass %), represented by $ViMe_2SiO(Me_2SiO)_{800}SiViMe_2$ was mixed together and a mixture liquid at room temperature that did not exhibit hot-melt properties was obtained.

Reference Example 6

270.5 g of an Organopolysiloxane 55 mass % xylene solution represented by the average unit formula: $(Me_2ViSiO_{1/2})_{0.05}(Me_3SiO_{1/2})_{0.39}(SiO_{4/2})_{0.56}(HO_{1/2})_{0.02}$ as well as 0.375 g of platinum 1,3-divinyltetramethyldisiloxane complex 1,3-divinyltetramethyldisiloxane solution (platinum metal content=approximately 4,000 ppm) were introduced into a 1 L flask in white solid form at 25° C. and were stirred to uniformity at room temperature (25° C.) to prepare an organopolysiloxane resin (6) xylene solution containing 10 ppm in terms of mass units as platinum metal.
In addition, the organopolysiloxane resin (6) did not soften/melt even when heated to 200° C. and did not have hot-melt properties. The weight average molecular weight obtained through GPC measurement with toluene solvent was 18,000 Da.

Reference Example 7

270.5 g of an Organopolysiloxane 55 mass % xylene solution represented by the average unit formula: $(Me_2ViSiO_{1/2})_{0.09}(Me_3SiO_{1/2})_{0.43}(SiO_{4/2})_{0.48}(HO_{1/2})_{0.03}$ as well as 0.375 g of platinum 1,3-divinyltetramethyldisiloxane complex 1,3-divinyltetramethyldisiloxane solution (platinum metal content=approximately 4,000 ppm) were introduced into a 1 L flask in white solid form at 25° C. and were stirred to uniformity at room temperature (25° C.) to prepare an organopolysiloxane resin (7) xylene solution containing 10 ppm in terms of mass units as platinum metal.
In addition, the organopolysiloxane resin (7) did not soften/melt even when heated to 200° C. and did not have hot-melt properties. The weight average molecular weight obtained through GPC measurement with toluene solvent was 2,900 Da.

Reference Example 8

Non-Hot-Melt Organopolysiloxane Resin Microparticles (1)

A xylene solution of the organopolysiloxane resin (1) prepared in Reference Example 1 was converted into particles while removing the xylene by a spray method using a spray dryer at 50° C. to obtain regular spherical shape microparticles. The microparticles were aged in an oven set at 120° C. for 24 hours to prepare regular spherical shape, non-hot-melt organopolysiloxane resin microparticles (1). The microparticles were observed using optical microscopy to have a particle diameter of 5 to 10 μm. The microparticles were exposed to 200° C. for 1 hour, and the loss on heating was 0.8 wt %.

Reference Example 9

Non-Hot-Melt Organopolysiloxane Resin Microparticles (2)

A xylene solution of the organopolysiloxane resin (2) prepared in Reference Example 2 was converted into particles while removing the xylene by a spray method using a spray dryer at 50° C. to obtain regular spherical shape microparticles. The microparticles were aged in an oven set at 120° C. for 24 hours to prepare regular spherical shape, non-hot-melt organopolysiloxane resin microparticles (2). The microparticles were observed using optical microscopy to have a particle diameter of 5 to 10 μm. The microparticles were exposed to 200° C. for 1 hour, and the loss on heating was 0.8 wt %.

Reference Example 10

Non-Hot-Melt Organopolysiloxane Resin Microparticles (3)

A xylene solution of the organopolysiloxane resin (3) prepared in Reference Example 3 was converted into particles while removing the xylene by a spray method using a spray dryer at 50° C. to obtain regular spherical shape microparticles. The microparticles were aged in an oven set at 120° C. for 24 hours to prepare regular spherical shape, non-hot-melt organopolysiloxane resin microparticles (3). The microparticles were observed using optical microscopy to have a particle diameter of 5 to 10 μm. The microparticles were exposed to 200° C. for 1 hour, and the loss on heating was 0.7 wt %.

Reference Example 11

Non-Hot-Melt Organopolysiloxane Resin Microparticles (4)

A xylene solution of the organopolysiloxane resin (4) prepared in Reference Example 4 was converted into particles while removing the xylene by a spray method using a spray dryer at 50° C. to obtain regular spherical shape microparticles. The microparticles were aged in an oven set at 120° C. for 24 hours to prepare regular spherical shape, non-hot-melt organopolysiloxane resin microparticles (4). The microparticles were observed using optical microscopy to have a particle diameter of 5 to 10 μm. The microparticles were exposed to 200° C. for 1 hour, and the loss on heating was 0.7 wt %.

Reference Example 12

Non-Hot-Melt Organopolysiloxane Resin Microparticles (6)

A xylene solution of the organopolysiloxane resin (6) prepared in Reference Example 6 was converted into particles while removing the xylene by a spray method using a spray dryer at 50° C. to obtain regular spherical shape microparticles. The microparticles were aged in an oven set at 120° C. for 24 hours to prepare regular spherical shape, non-hot-melt organopolysiloxane resin microparticles (6). The microparticles were observed using optical microscopy to have a particle diameter of 5 to 10 μm. The microparticles were exposed to 200° C. for 1 hour, and the loss on heating was 0.7 wt %.

Reference Example 13

Non-Hot-Melt Organopolysiloxane Resin Microparticles (7)

A xylene solution of the organopolysiloxane resin (7) prepared in Reference Example 7 was converted into particles while removing the xylene by a spray method using a spray dryer at 50° C. to obtain regular spherical shape microparticles. The microparticles were aged in an oven set at 120° C. for 24 hours to prepare regular spherical shape, non-hot-melt organopolysiloxane resin microparticles (7). The microparticles were observed using optical microscopy to have a particle diameter of 5 to 10 μm. The microparticles were exposed to 200° C. for 1 hour, and the loss on heating was 0.7 wt %.

Example 1

69.9 g of non-hot-meltable organopolysiloxane resin microparticles (2) (vinyl group content=0 mass %);
29.9 g of dimethylpolysiloxane capped at both molecular terminals with dimethylvinylsiloxy groups represented by the formula: $ViMe_2SiO(Me_2SiO)_{800}SiViMe_2$ (vinyl group content=0.09 mass %),
0.2 g of organohydrogenpolysiloxane expressed by the formula: $Me_3SiO(MeHSiO)_7(Me_2SiO)_{6.5}SiMe_3$;
{an amount such that the silicon-bonded hydrogen atoms in the organohydrogenpolysiloxane is 1.4 mol relative to 1 mol of vinyl groups in the dimethylpolysiloxane capped at both molecular terminals with dimethylvinylsiloxy groups},
82.8 g of alumina with an average particle size of 0.44 μm (AES-12 manufactured by Sumitomo Chemical);
166.1 g of alumina with an average particle size of 3.0 μm (AL-M73A manufactured by Sumitomo Chemical);
364.1 g of alumina with an average particle size of 37.4 μm (AZ35-125 manufactured by Micron Company of Nippon Steel & Sumikin Materials Co., Ltd.); and
1-ethynyl-1-cyclohexanol (amount to achieve 1000 ppm in mass units for this composition);
were batch fed into a small grinder and stirring was performed for 1 minute at room temperature (25° C.) to prepare a uniform curable granular silicone composition. The composition contained 0.10 mole of vinyl groups in 100 g of silicone component. The measurement results of the melt viscosity and the like of this composition are shown in Table 1.

Example 2

68.5 g of non-hot-meltable organopolysiloxane resin microparticles (3) (vinyl group content=0 mass %);
1.5 g of non-hot-meltable organopolysiloxane resin microparticles (7) (vinyl group content=3.10 mass %);
29.7 g of dimethylpolysiloxane capped at both molecular terminals with dimethylvinylsiloxy groups represented by the formula: $ViMe_2SiO(Me_2SiO)_{800}SiViMe_2$ (vinyl group content=0.09 mass %);
0.30 g of organohydrogenpolysiloxane resin represented by the formula: $(HMe_2SiO_{1/2})_{0.67}(SiO_{4/2})_{0.33}$ (silicon-bonded hydrogen atom content=0.95 mass %)

{an amount such that the silicon-bonded hydrogen atom in the organohydrogenpolysiloxane resin is 1.1 mol relative to 1 mol of vinyl groups in the organopolysiloxane resin microparticle particles (7) and dimethylpolysiloxane capped at both molecular terminals with dimethylvinylsiloxy groups},
82.8 g of alumina with an average particle size of 0.44 μm (AES-12 manufactured by Sumitomo Chemical);
166.1 g of alumina with an average particle size of 3.0 μm (AL-M73A manufactured by Sumitomo Chemical);
364.1 g of alumina with an average particle size of 37.4 μm (AZ35-125 manufactured by Micron Company of Nippon Steel & Sum ikin Materials Co., Ltd.); and
1-ethynyl-1-cyclohexanol (amount to achieve 1000 ppm in mass units for this composition);
were batch fed into a small grinder and stirring was performed for 1 minute at room temperature (25° C.) to prepare a uniform curable granular silicone composition. The composition contained 0.27 mole of vinyl groups in 100 g of silicone component. The measurement results of the melt viscosity and the like of this composition are shown in Table 1.

Example 3

68.6 g of non-hot-meltable organopolysiloxane resin microparticles (4) (vinyl group content=0 mass %);
1.5 g of non-hot-meltable organopolysiloxane resin microparticles (7) (vinyl group content=1.91 mass %);
29.5 g of dimethylpolysiloxane capped at both molecular terminals with dimethylvinylsiloxy groups represented by the formula: $ViMe_2SiO(Me_2SiO)_{800}SiViMe_2$ (vinyl group content=0.09 mass %);
0.4 g of organohydrogenpolysiloxane expressed by the formula: $Me_3SiO(MeHSiO)_7(Me_2SiO)_{6.5}SiMe_3$;
{amount such that the silicon-bonded hydrogen atom in the organohydrogenpolysiloxane resin is 1.0 mol relative to 1 mol of vinyl groups in the organopolysiloxane resin microparticle particles (7) and dimethylpolysiloxane capped at both molecular terminals with dimethylvinylsiloxy groups},
82.8 g of alumina with an average particle size of 0.44 μm (AES-12 manufactured by Sumitomo Chemical);
166.1 g of alumina with an average particle size of 3.0 μm (AL-M73A manufactured by Sumitomo Chemical);
364.1 g of alumina with an average particle size of 37.4 μm (AZ35-125 manufactured by Micron Company of Nippon Steel & Sumikin Materials Co., Ltd.); and
1-ethynyl-1-cyclohexanol (amount to achieve 1000 ppm in mass units for this composition);
were batch fed into a small grinder and stirring was performed for 1 minute at room temperature (25° C.) to prepare a uniform curable granular silicone composition. The composition contained 0.27 mole of vinyl groups in 100 g of silicone component. The measurement results of the melt viscosity and the like of this composition are shown in Table 1.

Example 4

112.5 g of alumina with an average particle size of 0.44 μm (AES-12 manufactured by Sumitomo Chemical);
234.0 g of alumina with an average particle size of 3.0 μm (AL-M73A manufactured by Sumitomo Chemical);
553.1 g of alumina with an average particle size of 37.4 μm and viscosity of 23 mPa-s (AZ35-125 manufactured by Micron Company of Nippon Steel & Sumikin Materials Co., Ltd.);
3.6 g of dimethylpolysiloxane represented by the formula: $Me_2ViSiO(Me_2SiO)_{29}Si(OMe)_3$ (vinyl group content=1.30 mass %);
were batch fed into a small grinder and stirring was performed for 1 minute at 150° C., surface treatment was performed on the alumina and then the temperature of the grinder was returned to 25° C.
Next,
67.1 g of non-hot-meltable organopolysiloxane resin microparticles (3) (vinyl group content=0 mass %);
29.0 g of dimethylpolysiloxane capped at both molecular terminals with dimethylvinylsiloxy groups represented by the formula: $ViMe_2SiO(Me_2SiO)_{899}SiViMe_2$ (vinyl group content=0.09 mass %);
0.30 g of organohydrogenpolysiloxane resin represented by the formula: $(HMe_2SiO_{1/2})_{0.67}(SiO_{4/2})_{0.33}$ (silicon-bonded hydrogen atom content=0.95 mass %)
{an amount such that the silicon-bonded hydrogen atoms in the organohydrogenpolysiloxane is 1.0 mol relative to 1 mol of vinyl groups in the dimethylpolysiloxane capped at one or both molecular terminals with dimethylvinylsiloxy groups}; and
1-ethynyl-1-cyclohexanol (amount to make 1,000 ppm in mass units relative to this composition);
were batch fed into a small grinder and stirred for 1 minute at room temperature (25° C.) to prepare a uniform curable granular silicone composition. The composition contained 0.30 mole of vinyl groups in 100 g of silicone component. The measurement results of the melt viscosity and the like of this composition are shown in Table 1.

Example 5

112.5 g of alumina with an average particle size of 0.44 μm (AES-12 manufactured by Sumitomo Chemical);
234.0 g of alumina with an average particle size of 3.0 μm (AL-M73A manufactured by Sumitomo Chemical);
553.1 g of alumina with an average particle size of 37.4 μm and viscosity of 23 mPa-s (AZ35-125 manufactured by Micron Company of Nippon Steel & Sumikin Materials Co., Ltd.);
3.6 g of dimethylpolysiloxane represented by the formula: $Me_2ViSiO(Me_2SiO)_{29}Si(OMe)_3$ (vinyl group content=1.30 mass %);
were batch fed into a small grinder and stirring was performed for 1 minute at 150° C., surface treatment was performed on the alumina and then the temperature of the grinder was returned to 25° C.
Next,
67.1 g of non-hot-meltable organopolysiloxane resin microparticles (4) (vinyl group content=0 mass %);
28.8 g of dimethylpolysiloxane capped at both molecular terminals with dimethylvinylsiloxy groups represented by the formula: $ViMe_2SiO(Me_2SiO)_{800}SiViMe_2$ (vinyl group content=0.09 mass %);
0.5 g of organohydrogenpolysiloxane expressed by the formula: $Me_3SiO(MeHSiO)_7(Me_2SiO)_{6.5}SiMe_3$;
{an amount such that the silicon-bonded hydrogen atoms in the organohydrogenpolysiloxane is 1.3 mol relative to 1 mol of vinyl groups in the dimethylpolysiloxane capped at one or both molecular terminals with dimethylvinylsiloxy groups}; and
1-ethynyl-1-cyclohexanol (amount to make 1,000 ppm in mass units relative to this composition);
were batch fed into a small grinder and stirred for 1 minute at room temperature (25° C.) to prepare a uniform curable granular silicone composition. The composition contained 0.30 mole of vinyl groups in 100 g of silicone component. The measurement results of the melt viscosity and the like of this composition are shown in Table 1.

Example 6

112.5 g of alumina with an average particle size of 0.44 μm (AES-12 manufactured by Sumitomo Chemical);
234.0 g of alumina with an average particle size of 3.0 μm (AL-M73A manufactured by Sumitomo Chemical);
553.1 g of alumina with an average particle size of 37.4 μm and viscosity of 23 mPa-s (AZ35-125 manufactured by Micron Company of Nippon Steel & Sumikin Materials Co., Ltd.);
3.6 g of dimethylpolysiloxane represented by the formula: $Me_2ViSiO(Me_2SiO)_{29}Si(OMe)_3$ (vinyl group content=1.30 mass %);
were batch fed into a small grinder and stirring was performed for 1 minute at 150° C., surface treatment was performed on the alumina and then the temperature of the grinder was returned to 25° C.
Next,
66.8 g of non-hot-meltable organopolysiloxane resin microparticles (4) (vinyl group content=0 mass %);
0.5 g of non-hot-meltable organopolysiloxane resin microparticles (7) (vinyl group content=1.91 mass %);
28.8 g of dimethylpolysiloxane capped at both molecular terminals with dimethylvinylsiloxy groups represented by the formula: $ViMe_2SiO(Me_2SiO)_{800}SiViMe_2$ (vinyl group content=0.09 mass %);
0.35 g of organohydrogenpolysiloxane resin represented by the formula: $(HMe_2SiO_{1/2})_{0.67}(SiO_{4/2})_{0.33}$ (silicon-bonded hydrogen atom content=0.95 mass %)
{amount such that the silicon-bonded hydrogen atom in the organohydrogenpolysiloxane resin is 1.0 mol relative to 1 mol of vinyl groups in the dimethylpolysiloxane capped at one or both molecular terminals with dimethylvinylsiloxy groups and organopolysiloxane resin microparticle particles (7)}; and
1-ethynyl-1-cyclohexanol (amount to make 1,000 ppm in mass units relative to this composition);
were batch fed into a small grinder and stirred for 1 minute at room temperature (25° C.) to prepare a uniform curable granular silicone composition. The composition contained 0.30 mole of vinyl groups in 100 g of silicone component. The measurement results of the melt viscosity and the like of this composition are shown in Table 1.

Comparative Example 1

67.0 g of non-hot meltable organopolysiloxane resin microparticles (1) (vinyl group content=0 mass %);
33.0 g of dimethylpolysiloxane capped at both molecular terminals with dimethylvinylsiloxy groups represented by $ViMe_2SiO(Me_2SiO)_{800}SiViMe_2$ (content of vinyl groups=0.09 mass %);
0.2 g of organohydrogenpolysiloxane expressed by the formula: $Me_3SiO(MeHSiO)_7(Me_2SiO)_{6.5}SiMe_3$;
{an amount such that the silicon-bonded hydrogen atoms in the organohydrogenpolysiloxane resin is 1.4 mol relative to 1 mol of vinyl groups in the dimethylpolysiloxane capped at both molecular terminals with dimethylvinylsiloxy groups},
82.8 g of alumina with an average particle size of 0.44 μm (AES-12 manufactured by Sumitomo Chemical);
166.1 g of alumina with an average particle size of 3.0 μm (AL-M73A manufactured by Sumitomo Chemical);
364.1 g of alumina with an average particle size of 37.4 μm (AZ35-125 manufactured by Micron Company of Nippon Steel & Sum ikin Materials Co., Ltd.); and
1-ethynyl-1-cyclohexanol (amount to achieve 1000 ppm in mass units for this composition);
were batch fed into a small grinder and stirring was performed for 1 minute at room temperature (25° C.) to prepare a uniform curable granular silicone composition. The composition contained 0.1 mole of vinyl groups in 100 g of silicone component. The measurement results of the melt viscosity and the like of this composition are shown in Table 1.

Comparative Example 2

62.5 g of non-hot-meltable organopolysiloxane resin microparticles (1) (vinyl group content=0 mass %);
5.0 g of non-hot-meltable organopolysiloxane resin microparticles (7) (vinyl group content=3.1 mass %);
31.3 g of dimethylpolysiloxane capped at both molecular terminals with dimethylvinylsiloxy groups represented by $ViMe_2SiO(Me_2SiO)_{800}SiViMe_2$ (content of vinyl groups=0.09 mass %);
1.2 g of organohydrogenpolysiloxane expressed by the formula: $Me_3SiO(MeHSiO)_7(Me_2SiO)_{6.5}SiMe_3$;
{amount such that the silicon-bonded hydrogen atom in the organohydrogenpolysiloxane resin is 1.2 mol relative to 1 mol of vinyl groups in the organopolysiloxane resin microparticle particles (7) and dimethylpolysiloxane capped at both molecular terminals with dimethylvinylsiloxy groups},
82.8 g of alumina with an average particle size of 0.44 μm (AES-12 manufactured by Sumitomo Chemical);
166.1 g of alumina with an average particle size of 3.0 μm (AL-M73A manufactured by Sumitomo Chemical);
364.1 g of alumina with an average particle size of 37.4 μm (AZ35-125 manufactured by Micron Company of Nippon Steel & Sum ikin Materials Co., Ltd.); and
1-ethynyl-1-cyclohexanol (amount to achieve 1000 ppm in mass units for this composition);
were batch fed into a small grinder and stirring was performed for 1 minute at room temperature (25° C.) to prepare a uniform curable granular silicone composition. The composition contained 0.7 mole of vinyl groups in 100 g of silicone component. The measurement results of the melt viscosity and the like of this composition are shown in Table 1.

Comparative Example 3

60.2 g of non-hot-meltable organopolysiloxane resin microparticles (1) (vinyl group content=0 mass %);
7.0 g of non-hot-meltable organopolysiloxane resin microparticles (6) (vinyl group content=1.91 mass %);
32.8 g of dimethylpolysiloxane capped at both molecular terminals with dimethylvinylsiloxy groups represented by the formula: $ViMe_2SiO(Me_2SiO)_{800}SiViMe_2$ (vinyl group content=0.09 mass %);
0.65 g of organohydrogenpolysiloxane resin represented by the formula: $(HMe_2SiO_{1/2})_{0.67}(SiO_{4/2})_{0.33}$ (silicon-bonded hydrogen atom content=0.95 mass %);
{an amount such that the silicon-bonded hydrogen atom in the organohydrogenpolysiloxane resin is 1.0 mol relative to 1 mol of vinyl groups in the organopolysiloxane resin microparticle particles (6) and dimethylpolysiloxane capped at both molecular terminals with dimethylvinylsiloxy groups}
82.8 g of alumina with an average particle size of 0.44 μm (AES-12 manufactured by Sumitomo Chemical);
166.1 g of alumina with an average particle size of 3.0 μm (AL-M73A manufactured by Sumitomo Chemical);
364.1 g of alumina with an average particle size of 37.4 μm (AZ35-125 manufactured by Micron Company of Nippon Steel & Sum ikin Materials Co., Ltd.); and
1-ethynyl-1-cyclohexanol (amount to achieve 1000 ppm in mass units for this composition);
were batch fed into a small grinder and stirring was performed for 1 minute at room temperature (25° C.) to prepare a uniform curable granular silicone composition. The composition contained 0.6 mole of vinyl groups in 100 g of silicone component. The measurement results of the melt viscosity and the like of this composition are shown in Table 1.

Comparative Example 4

112.5 g of alumina with an average particle size of 0.44 μm (AES-12 manufactured by Sumitomo Chemical);
234.0 g of alumina with an average particle size of 3.0 μm (AL-M73A manufactured by Sumitomo Chemical);
553.1 g of alumina with an average particle size of 37.4 μm and viscosity of 23 mPa-s (AZ35-125 manufactured by Micron Company of Nippon Steel & Sumikin Materials Co., Ltd.);
3.6 g of dimethylpolysiloxane represented by the formula: $Me_2ViSiO(Me_2SiO)_{29}Si(OMe)_3$ (vinyl group content=1.30 mass %);
were batch fed into a small grinder and stirring was performed for 1 minute at 150° C., surface treatment was performed on the alumina and then the temperature of the grinder was returned to 25° C.
Next,
67.0 g of non-hot-meltable organopolysiloxane resin microparticles (1) (vinyl group content=0 mass %);
33.0 g of dimethylpolysiloxane capped at both molecular terminals with dimethylvinylsiloxy groups represented by

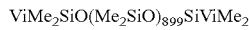
$ViMe_2SiO(Me_2SiO)_{899}SiViMe_2$ (content of vinyl groups=0.09 mass %);
0.5 g of organohydrogenpolysiloxane expressed by the formula: $Me_3SiO(MeHSiO)_7(Me_2SiO)_{6.5}SiMe_3$;
{an amount such that the silicon-bonded hydrogen atoms in the organohydrogenpolysiloxane resin is 1.2 mol relative to 1 mol of vinyl groups in the dimethylpolysiloxane capped at both molecular terminals or one terminal described below with dimethylvinylsiloxy groups}; and
1-ethynyl-1-cyclohexanol (amount to make 1,000 ppm in mass units relative to this composition);
were batch fed into a small grinder and stirred for 1 minute at room temperature (25° C.) to prepare a uniform curable granular silicone composition. The composition contained 0.30 mole of vinyl groups in 100 g of silicone component. The measurement results of the melt viscosity and the like of this composition are shown in Table 1.

Comparative Example 5

112.5 g of alumina with an average particle size of 0.44 μm (AES-12 manufactured by Sumitomo Chemical);
234.0 g of alumina with an average particle size of 3.0 μm (AL-M73A manufactured by Sumitomo Chemical);
553.1 g of alumina with an average particle size of 37.4 μm and viscosity of 23 mPa-s (AZ35-125 manufactured by Micron Company of Nippon Steel & Sumikin Materials Co., Ltd.);
3.6 g of dimethylpolysiloxane represented by the formula: $Me_2ViSiO(Me_2SiO)_{29}Si(OMe)_3$ (vinyl group content=1.30 mass %);
were batch fed into a small grinder and stirring was performed for 1 minute at 150° C., surface treatment was performed on the alumina and then the temperature of the grinder was returned to 25° C.
Next,
67.0 g of non-hot-meltable organopolysiloxane resin microparticles (1) (vinyl group content=0 mass %);
33.0 g of dimethylpolysiloxane capped at both molecular terminals with dimethylvinylsiloxy groups represented by

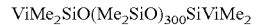
$ViMe_2SiO(Me_2SiO)_{300}SiViMe_2$ (content of vinyl groups=0.22 mass %);
0.7 g of organohydrogenpolysiloxane expressed by the formula: $Me_3SiO(MeHSiO)_7(Me_2SiO)_{6.5}SiMe_3$;
{an amount such that the silicon-bonded hydrogen atoms in the organohydrogenpolysiloxane resin is 1.1 mol relative to 1 mol of vinyl groups in the dimethylpolysiloxane capped at both molecular terminals or one terminal described below with dimethylvinylsiloxy groups}; and
1-ethynyl-1-cyclohexanol (amount to make 1,000 ppm in mass units relative to this composition);
were batch fed into a small grinder and stirred for 1 minute at room temperature (25° C.) to prepare a uniform curable granular silicone composition. The composition contained 0.5 mol of vinyl groups in 100 g of silicone component. The measurement results of the melt viscosity and the like of this composition are shown in Table 1.

TABLE 1

| | Examples | | | | | | Comparative Examples | | | | |
|---|---|---|---|---|---|---|---|---|---|---|---|
| | 1 | 2 | 3 | 4 | 5 | 6 | 1 | 2 | 3 | 4 | 5 |
| Organopolysiloxane resin fine particle No./g | (2) 29.9 | (3) 68.5 | (4) 68.6 | (3) 67.1 | (4) 67.1 | (4) 66.8 | (1) 67.0 | (1) 62.5 | (1) 60.2 | (1) 67.0 | (1) 67.0 |
| Weight average molecular weight Mw | 11,000 | 7,000 | 4,000 | 7,000 | 4,000 | 4,000 | 18,500 | 18,500 | 18,500 | 18,500 | 18,500 |
| Organopolysiloxane resin fine particle No./g | — | (7) 1.5 | (7) 1.5 | — | — | (7) 0.5 | — | (7) 5.0 | (6) 7.0 | — | — |

TABLE 1-continued

|  | Examples | | | | | | Comparative Examples | | | | |
| --- | --- | --- | --- | --- | --- | --- | --- | --- | --- | --- | --- |
|  | 1 | 2 | 3 | 4 | 5 | 6 | 1 | 2 | 3 | 4 | 5 |
| Weight average molecular weight Mw | — | 2,900 | 2,900 | — | — | 2,900 | — | 2,900 | 18,000 | — | — |
| Vinyl group content Mol/100 g | 0.10 | 0.27 | 0.27 | 0.30 | 0.30 | 0.30 | 0.10 | 0.70 | 0.60 | 0.30 | 0.50 |
| Melt viscosity @ 150° C. [Pas]. | 100 | 50 | 30 | 65 | 40 | 40 | 280 | 190 | 330 | N/A (No melting) | 250 |
| Storage elastic modulus @ 25° C. [MPa] | 44 | 89 | 54 | 41 | 28 | 58 | 270 | 380 | 350 | N/A | 480 |
| Tensile Elongation [%] | 130 | 74 | 68 | 52 | 48 | 31 | 11 | 2 | 6 | N/A | 2 |
| Thermal Conductivity [W/mK] | 1.98 | 1.99 | 1.98 | 2.98 | 2.99 | 2.95 | 2.01 | 2.01 | 1.94 | N/A | 2.91 |

[Summary]

The curable silicone compositions of Examples 1 to 6 of the present invention are hot-melt compositions having relatively low melt viscosity even when a large amount of alumina filler is blended in, and the storage elastic modulus of the cured product thereof is not an extremely high value, and an extreme decrease in the tensile elongation modulus is not observed. Furthermore, the thermal conductivity of the obtained cured product increased with the alumina content. In other words, the curable compositions of Examples 1 to 6 provided cured product that exhibited moderate flexibility in addition to favorable hot-melt properties, even though they contained extremely large amounts of functional inorganic filler.

On the other hand, Comparative Examples 1 to 5 all contain organopolysiloxane resins with a weight average molecular weight that exceeds the value specified in the present invention, and Comparative Examples 1, 2, 3 and 5 all showed extremely low values of tensile elongation rate. In addition, the melting properties of Comparative Example 4 were highly deteriorated. As shown in Reference Example 5, if the weight average molecular weight of the organopolysiloxane resin is less than the lower limit specified in the present invention, a hot-melt composition can not be obtained.

Manufacturing Example 1

The granulated curable silicone composition, such as Example 1 above, was heated to 80° C., heated and melted using a twin-screw extruder, and kneaded in the form of a semi-solid softened material, and then fed onto a release film (Biwa Liner manufactured by Takara Inc.) at a feed rate of 5 kg/hour and laminated between the two release films. The laminate body was then stretched between rolls to form a laminate body in which a hot-melt curable silicone sheet having a thickness of 500 μm is laminated between two peelable films, and the entire laminate body was cooled by a cooling roll set at −15° C. In said laminate body, a flat and uniform hot-meltable curable silicone sheet was obtained by separating the release film.

Manufacturing Example 2

The granulated curable silicone compositions of Example 1 and the like described above were heated to 80° C., then heated, melted, and kneaded using a twin-screw extruder, and formed into a sheet shape using a T-type die (opening dimensions: 800 μm×100 mm, heated to 80° C.), and then fed onto a release film (Biwa Liner manufactured by Takara Inc.) at a feed rate of 5 kg/hour. The entire sheet was cooled by a cooling roll set at −15° C., and then laminated between the two release films. The laminate body was then stretched between rolls to form a laminate body in which a hot-melt curable silicone sheet having a thickness of 500 μm is laminated between two peelable films. In said laminate body, a flat and uniform hot-meltable curable silicone sheet was obtained by separating the release film.

The invention claimed is:

1. A curable silicone composition having hot-melt properties, comprising:
   (A) an organopolysiloxane resin component having a weight average molecular weight (Mw) in the range of 2,000 to 15,000 as measured by gel permeation chromatography (GPC) using toluene as a solvent, where 20 mol % or more of the total siloxane units of the organopolysiloxane resin component is siloxane units represented by $SiO_{4/2}$; and
   D) one or more functional fillers;
   wherein the organopolysiloxane resin component comprises a curing reactive functional group containing a carbon-carbon double bond and, of that curing reactive functional group, 0.05 to 1.50 mol vinyl ($CH2=CH-$) group is contained per 100 g of silicone component in the composition.

2. The curable silicone composition according to claim 1, comprising:
   (A) 100 mass parts of organopolysiloxane resin component containing the following component (A1) and component (A2) in a mass ratio of 0:100 to 75:25, and the weight average molecular weight (Mw) of component (A1) and component (A2) is in the range of 2,000 to 15,000 as measured by gel permeation chromatography (GPC) using toluene as a solvent and polystyrene standards;
      (A1) an organopolysiloxane resin having no hot-melt properties as a whole molecule, having a curing reactive functional group containing a carbon-carbon double bond in the molecule, and where 20 mol % or more of the total siloxane units of the organopolysiloxane resin is siloxane units represented by $SiO_{4/2}$;

(A2) an organopolysiloxane resin having no hot-melt properties as a whole molecule, having no curing reactive functional groups containing a carbon-carbon double bond in the molecule, and where 20 mol % or more of the total siloxane units of the organopolysiloxane resin is siloxane units represented by $SiO_{4/2}$;

(B) 10 to 100 mass parts of a straight-or branched-chain organopolysiloxane, liquid at 25° C., and having at least two curing reactive functional groups containing a carbon-carbon double bond in the molecule;

(C) one or more curing agents selected from (c1) or (c2) below, in an amount necessary to cure the composition:
  (c1) an organic peroxide,
  (c2) an organohydrogenpolysiloxane having at least two silicon-bonded hydrogen atoms in the molecule and a hydrosilylation reaction catalyst; and (D) functional filler;
  wherein the amount of component (D) is in the range of 10 to 2000 mass parts relative to 100 mass parts of the sum of component (A) and component (B).

3. The curable silicone composition according to claim 2, wherein:
component (A1) is an organopolysiloxane resin (A1-1) not having hot-melt properties and represented by the following average unit formula:

$$(R^1{}_3SiO_{1/2})_a(R^1{}_2SiO_{2/2})_b(R^1SiO_{3/2})_c(SiO_{4/2})_d(R^2O_{1/2})_e$$

where each $R^1$ is an independent monovalent hydrocarbon group having 1 to 10 carbon atoms, however, 1 to 12 mol % of all $R^1$ in a molecule is an alkenyl group; each $R^2$ is a hydrogen atom or an alkyl group having 1 to 10 carbon atoms; and a, b, c, d, and e are numbers satisfying the following: $0.10 \leq a \leq 0.60$, $0 \leq b \leq 0.70$, $0 \leq c \leq 0.80$, $0 \leq d \leq 0.65$, $0 \leq e \leq 0.05$, $(c+d) > 0.20$, and $(a+b+c+d)=1$;

component (A2) is a non-hot-meltable organopolysiloxane resin (A2-1) represented by the following average unit formula:

$$(R^3{}_3SiO_{1/2})_f(R^3{}_2SiO_{2/2})_g(R^3SiO_{3/2})_h(SiO_{4/2})_i(R^2O_{1/2})_j$$

where each $R^3$ is independently a monovalent hydrocarbon group having 1 to 10 carbon atoms and not containing a carbon-carbon double bond; $R^2$ is a hydrogen atom with an alkyl group having 1 to 10 carbon atoms; and f, g, h, i, and j are numbers satisfying the following: $0.35 \leq f \leq 0.55$, $0 \leq g \leq 0.20$, $0 \leq h \leq 0.20$, $0.45 \leq i \leq 0.65$, $0 \leq j \leq 0.05$, and $(f+g+h+i)=1$;

component (B) is a straight-chain diorganopolysiloxane (B1) represented by the following structural formula:

$$R^4{}_3SiO(SiR^4{}_2O)_kSiR^4{}_3$$

where each $R^4$ is independently a monovalent hydrocarbon group having 1 to 10 carbon atoms, except that at least two of the $R^4$ in one molecule are alkenyl groups, and k is a number from 20 to 5,000.

4. The curable silicone composition according to claim 2, wherein component (A1) and component (A2) are spherical organopolysiloxane resin microparticles having an average primary particle diameter of 1 to 20 μm.

5. The curable silicone composition according to claim 2, wherein for component (C), the content of the organohydrogenpolysiloxane is an amount where the molar ratio of the silicon-bonded hydrogen atoms in the organohydrogenpolysiloxane resin relative to the curing reactive functional groups containing carbon-carbon double bonds in component (A) and component (B) is in the range of 0.5 to 20.

6. The curable silicone composition according to claim 2, wherein component (D) is a functional filler containing one or more types selected from the group consisting of a reinforcing filler, a white pigment, a thermally conductive filler, an electrically conductive filler, and an organic filler.

7. The curable silicone composition according to claim 1, in a granular, pellet, or sheet form.

8. A substantially flat, 10 to 1000 μm thick, curable silicone composition sheet formed from the curable silicone composition according to claim 1.

9. A film-like adhesive, comprising the curable silicone composition sheet according to claim 8.

10. A peelable laminate, comprising:
the curable silicone composition sheet according to claim 8, and
a sheet-like substrate with a release surface facing the curable silicone composition sheet on one or both surfaces of the curable silicone composition sheet.

11. A cured product obtained by curing the curable silicone composition according to claim 1.

12. A member for a semiconductor device, the member comprising the cured product of claim 11.

13. A semiconductor device, comprising the cured product according to claim 11.

14. A method for manufacturing the curable silicone composition according to claim 1, wherein each component that makes up the curable silicone composition is granulated by mixing under temperature conditions not exceeding 50° C.

15. A method of molding a cured product, comprising the following steps:
(I) heating and melting the curable silicone composition according to claim 1 at a temperature of 100° C. or higher;
(II) injecting the curable silicone composition in a liquid state obtained in step (I) into a mold or distributing the curable silicone composition obtained in step (I) to a mold by clamping; and
(III) curing the curable silicone composition injected or distributed in step (II).

16. A method for manufacturing the curable silicone composition sheet according to claim 8, comprising the following steps:
1) mixing raw material components of the curable silicone composition at a temperature of 50° C. or higher;
2) kneading a mixture obtained in step 1) while heating and melting;
3) laminating a heated and melted mixture obtained in step 2) between films provided with at least one release surface; and
4) extending a laminate body obtained in step 3) between rollers to mold a curable silicone sheet having a specific film thickness.

* * * * *